(12) United States Patent
Obana et al.

(10) Patent No.: US 8,586,977 B2
(45) Date of Patent: Nov. 19, 2013

(54) METHOD OF MANUFACTURING ORGANIC EL DISPLAY UNIT

(75) Inventors: Yoshiaki Obana, Kanagawa (JP); Tomoyuki Higo, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/563,139

(22) Filed: Jul. 31, 2012

(65) Prior Publication Data

US 2012/0295381 A1 Nov. 22, 2012

Related U.S. Application Data

(62) Division of application No. 12/941,463, filed on Nov. 8, 2010.

(30) Foreign Application Priority Data

Nov. 16, 2009 (JP) ................................. 2009-261354

(51) Int. Cl.
*H01L 35/24* (2006.01)

(52) U.S. Cl.
USPC ................. 257/40; 257/89; 257/79; 428/690; 313/504

(58) Field of Classification Search
USPC .................... 438/29; 257/40, 89, 79; 428/690; 313/504
See application file for complete search history.

(56) References Cited

U.S. PATENT DOCUMENTS

| | | | |
|---|---|---|---|
| 6,863,961 B2 | 3/2005 | Miyashita et al. | |
| 2006/0105201 A1* | 5/2006 | Lee et al. | 428/690 |
| 2007/0009762 A1* | 1/2007 | Hamada et al. | 428/690 |

FOREIGN PATENT DOCUMENTS

| | | |
|---|---|---|
| JP | 10-153967 | 6/1998 |
| JP | 2003-332055 | 11/2003 |
| JP | 2006-185864 | 7/2006 |
| JP | 2007-015933 | 1/2007 |
| JP | 2007-073532 | 3/2007 |
| JP | 2007-134503 | 5/2007 |
| JP | 2007-137801 | 6/2007 |
| JP | 2007-169292 | 7/2007 |
| JP | 2007-207546 | 8/2007 |
| JP | 2008-177145 | 7/2008 |
| JP | 2008-288201 | 11/2008 |

OTHER PUBLICATIONS

Japanese Office Action issued Jun. 4, 2013 for corresponding Japanese Appln. No. 2009-261354.

* cited by examiner

*Primary Examiner* — Eva Yan Montalvo
(74) *Attorney, Agent, or Firm* — K&L Gates LLP

(57) ABSTRACT

A method of manufacturing an organic EL display unit and an organic EL display unit capable of improving light emitting efficiency and life of blue are provided. A hole injection layer are formed on a lower electrode. For a red organic EL device and a green organic EL device, a hole transport layer, a red light emitting layer, and a green light emitting layer made of a polymer material are formed. A hole transport layer made of a low molecular material is formed on the hole injection layer of a blue organic EL device. A blue light emitting layer made of a low molecular material is formed on the red light emitting layer, the green light emitting layer, and the hole transport layer for the blue organic EL device. An electron transport layer, an electron injection layer, and an upper electrode are sequentially formed on the blue light emitting layer.

6 Claims, 11 Drawing Sheets

METHOD OF MANUFACTURING ORGANIC EL DISPLAY UNIT

CROSS REFERENCES TO RELATED APPLICATIONS

The present application is a divisional of U.S. application Ser. No. 12/941,463 filed on Nov. 8, 2010, and which claims priority to Japanese Priority Patent Application JP 2009-261354 filed in the Japan Patent Office on Nov. 16, 2009, the entire content of which is hereby incorporated by reference.

BACKGROUND

The present application relates to a method of manufacturing an organic electroluminescence (EL) display unit that emits light by using organic EL phenomenon and an organic EL display unit.

As development of information and communications industry has been accelerated, a display device having high performance has been demanded. Specially, as a next generation display device, an organic EL device has attracted attentions. As a self light emitting type display device, the organic EL device has an advantage that the view angle is wide and the contrast is excellent. In addition, the organic EL device has an advantage that the response time is short.

A light emitting layer and the like forming the organic EL device are broadly classified into a low molecular material and a polymer material. In general, it is known that the low molecular material provides higher light emitting efficiency and a longer life. In particular, the low molecular material provides a higher performance for blue.

Further, regarding a method of forming the organic film thereof, the low molecular material is formed by dry method such as a vacuum evaporation method, and the polymer material is formed by wet method such as spin coating, ink jet method, and nozzle coating.

The dry method has an advantage that a formation material of the organic thin film layer is not necessarily dissolved in a solvent, and the solvent is not necessarily removed after forming the film. However, the vacuum evaporation method has disadvantages as follows. That is, in particular, separate coating by using a metal mask is difficult. In particular, in forming a large panel, the vacuum evaporation method leads to high facility manufacturing cost, is not applicable to a large screen substrate, and is not suitable for mass production.

Thus, the wet method having an advantage that a large display screen area is comparatively easily realized by the ink jet method and nozzle coating method has attracted attentions.

SUMMARY

However, since a blue light emitting material does not show favorable light emitting luminance and favorable life and is still not practical, patterning by coating method such as ink jet method and nozzle coating method has been difficult.

Thus, in Japanese Patent No. 4062352 and Japanese Patent No. 3899566, the following manufacturing method is disclosed. In the manufacturing method, a red organic light emitting layer and a green organic light emitting layer are formed by ink jet method, and a blue organic light emitting layer is formed by evaporation. In the manufacturing method of Japanese Patent No. 4062352 and Japanese Patent No. 3899566, the blue light emitting layer is formed by evaporation method with the use of a highly practical low molecular material. Thus, the cost is low, and there is a high possibility to realize a large device. However, in view of practicality, light emitting efficiency and life of a blue pixel are still insufficient.

In view of the foregoing disadvantage, in the present application, it is desirable to provide a method of manufacturing an organic EL display unit and an organic EL display unit that are able to improve light emitting efficiency and life of blue.

According to an embodiment, there is provided a method of manufacturing an organic EL display unit including steps of: forming a lower electrode respectively for a red organic EL device, a green organic EL device, and a blue organic EL device on a substrate; forming a hole injection layer respectively for the red organic EL device, the green organic EL device, and the blue organic EL device on the lower electrode by coating method; forming a hole transport layer made of a polymer material respectively for the red organic EL device and the green organic EL device on the hole injection layer by coating method; forming a red light emitting layer made of a polymer material on the hole transport layer for the red organic EL device by coating method; forming a green light emitting layer made of a polymer material on the hole transport layer for the green organic EL device by coating method; forming a hole transport layer made of a low molecular material on the hole injection layer of the blue organic EL device by coating method; forming a blue light emitting layer made of a low molecular material on the whole area of the red light emitting layer, the green light emitting layer, and the hole transport layer for the blue organic EL device by evaporation method; and sequentially forming an electron transport layer, an electron injection layer, and an upper electrode on the whole area of the blue light emitting layer.

According to an embodiment, there is provided an organic EL display unit including: a lower electrode provided respectively for a red organic EL device, a green organic EL device, and a blue organic EL device on a substrate; a hole injection layer provided respectively for the red organic EL device, the green organic EL device, and the blue organic EL device on the lower electrode; a hole transport layer made of a polymer material provided respectively for the red organic EL device and the green organic EL device on the hole injection layer; a red light emitting layer made of a polymer material provided on the hole transport layer for the red organic EL device; a green light emitting layer made of a polymer material provided on the hole transport layer for the green organic EL device; a hole transport layer made of a low molecular material provided on the hole injection layer of the blue organic EL device; a blue light emitting layer made of a low molecular material provided on the whole area of the red light emitting layer, the green light emitting layer, and the hole transport layer for the blue organic EL device; and an electron transport layer, an electron injection layer, and an upper electrode sequentially provided on the whole area of the blue light emitting layer.

In the organic EL display unit of the embodiment, the hole transport layer for the blue organic EL device is made of the low molecular material. Thus, a state of interface with the blue light emitting layer made of the low molecular material is improved, and light emitting efficiency and life of blue are improved.

According to the method of manufacturing an organic EL display unit of the embodiment and the organic EL display unit of the embodiment, the hole transport layer made of the low molecular material is formed on the hole injection layer of the blue organic EL device by coating method. Thus, a state of interface with the blue light emitting layer made of the low molecular material is able to be improved, and light emitting efficiency and life of blue are able to be improved. Therefore, in the color organic EL display unit in which the red organic EL device, the green organic EL device, and the blue organic EL device are arranged, light emitting efficiency and life are further improved.

Additional features and advantages are described herein, and will be apparent from the following Detailed Description and the figures.

DETAILED DESCRIPTION

The present application which will be described in detail below with reference to the drawings according to an embodiment.

Figure 1:
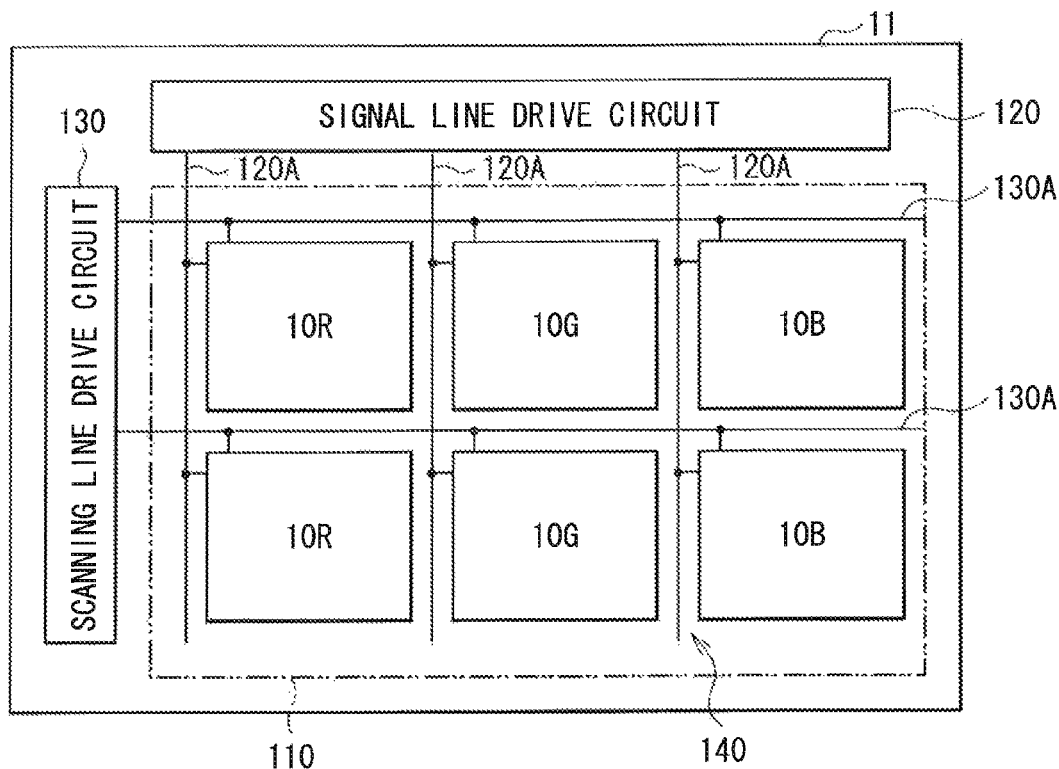
FIG. 1 is a diagram illustrating a structure of an organic EL display unit according to an embodiment.

FIG. 1 illustrates a structure of an organic EL display unit according to an embodiment. The organic EL display unit is used as an organic EL television device or the like. In the organic EL display unit, for example, as a display region 110, a plurality of red organic EL devices 10R, a plurality of green organic EL devices 10G, and a plurality of blue organic EL devices 10B described later are arranged in a matrix state over a substrate 11. A signal line drive circuit 120 and a scanning line drive circuit 130 that are drivers for displaying a video are provided on the periphery of the display region 110.

Figure 2:
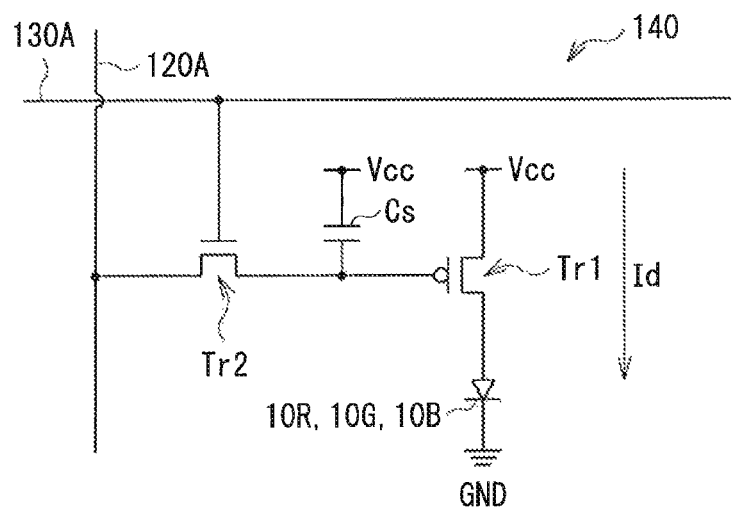
FIG. 2 is a diagram illustrating an example of a pixel drive circuit illustrated in FIG. 1.

In the display region 110, a pixel drive circuit 140 is provided. FIG. 2 illustrates an example of the pixel drive circuit 140. The pixel drive circuit 140 is an active drive circuit that is formed in a layer located lower than an after-mentioned lower electrode 14. In other words, the pixel drive circuit 140 has a drive transistor Tr1, a writing transistor Tr2, a capacitor (retentive capacity) Cs between the transistors Tr1 and Tr2, and the red organic EL device 10R (or the green organic EL device 10G or the blue organic EL device 10B) serially connected to the drive transistor Tr1 between a first power line (Vcc) and a second power line (GND). The drive transistor Tr1 and the writing transistor Tr2 are composed of a general thin film transistor (TFT). The structure thereof is not particularly limited, and may be, for example, inversely staggered structure (so-called bottom gate type) or staggered structure (top gate type).

In the pixel drive circuit 140, a plurality of signal lines 120A are arranged in the column direction, and a plurality of scanning lines 130A are arranged in the row direction. Each cross section between each signal line 120A and each scanning line 130A corresponds to one of the red organic EL device 10R, the green organic EL device 10G, and the blue organic EL device 10B (sub pixel). Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied to a gate electrode of the writing transistor Tr2 from the scanning line drive circuit 130 through the scanning line 130A.

Further, in the display region 110, the red organic EL device 10R generating red light, the green organic EL device 10G generating green light, and the blue organic EL device 10B generating blue light are sequentially arranged in a matrix state as a whole. A combination of the red organic EL device 10R, the green organic EL device 10G, and the blue organic EL device 10B adjacent to each other composes one pixel.

Figure 3:
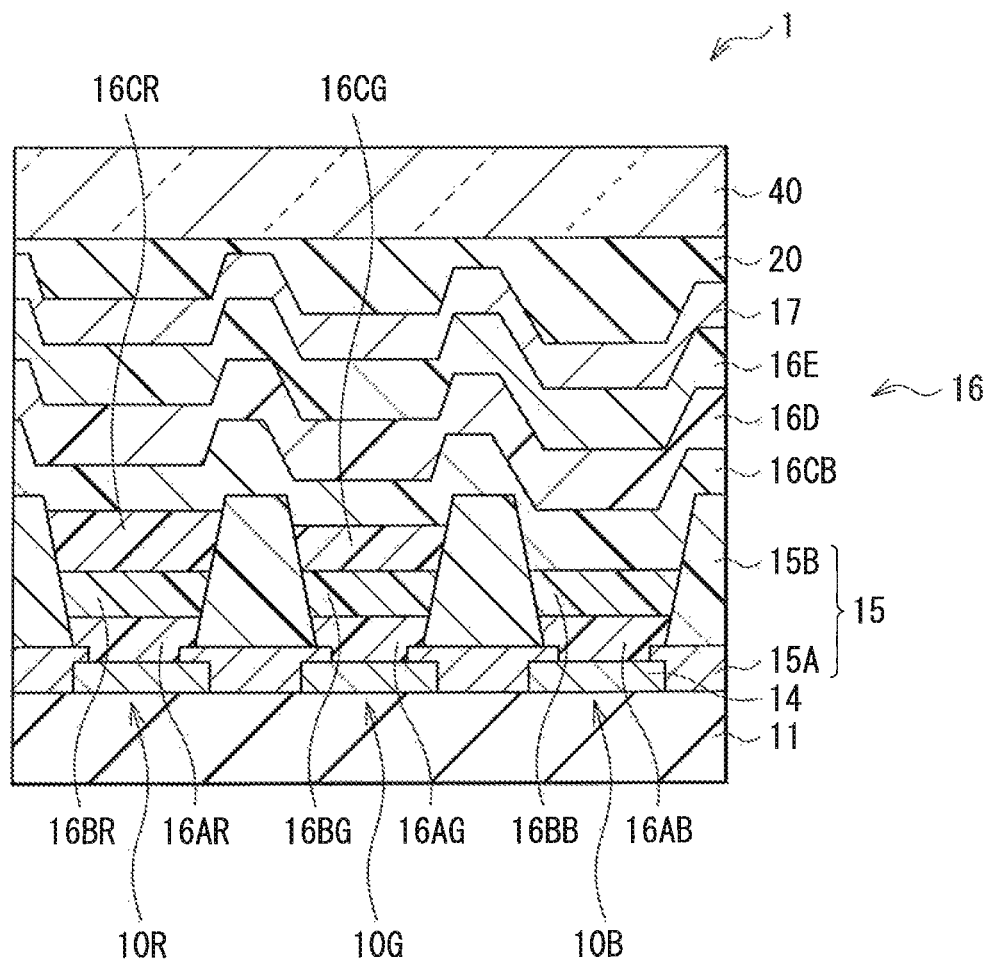
FIG. 3 is a cross sectional view illustrating a structure of a display region illustrated in FIG. 1.

FIG. 3 illustrates a cross sectional structure of the display region 110 illustrated in FIG. 1. The red organic EL device 10R, the green organic EL device 10G, and the blue organic EL device 10B respectively have a structure in which a lower electrode 14 as an anode, a dividing wall 15, an organic layer 16 including a light emitting layer 16C described later, and an upper electrode 17 as a cathode are layered in this order from the substrate 11 side with the drive transistor Tr1 of the foregoing pixel drive circuit 140 and a planarizing insulating film (not illustrated) in between.

The red organic EL device 10R, the green organic EL device 10G, and the blue organic EL device 10B as above are coated with a protective layer 20. Further, a sealing substrate 40 made of glass or the like is bonded to the whole area of the protective layer 20 with an adhesive layer (not illustrated) such as a thermoset resin and an ultraviolet curable resin in between, and therefore the red organic EL device 10R, the green organic EL device 10G, and the blue organic EL device 10B are sealed.

The substrate 11 is a support body in which the red organic EL device 10R, the green organic EL device 10G, and the blue organic EL device 10B are arranged on one main face side. The substrate 11 may be a known substrate, and is made of, for example, quartz, glass, a metal foil, a resin film, a resin sheet or the like. Specially, quartz and glass are preferable. Examples of resin include a methacryl resin represented by polymethyl methacrylate (PMMA), polyester such as polyethylene terephthalate (PET), polyethylene naphthalate (PEN), and polybutylene naphthalate (PBN), and a polycarbonate resin. A lamination structure and a surface treatment that inhibit water permeability and gas permeability should be provided.

The lower electrode 14 is provided on the substrate 11 respective for the red organic EL device 10R, the green organic EL device 10G, and the blue organic EL device 10B. The lower electrode 14 has a thickness in the lamination direction (hereinafter simply referred to as thickness) of, for example, from 10 nm to 1000 nm both inclusive. Examples of material of the lower electrode 14 include a simple substance or an alloy of metal elements such as chromium (Cr), gold (Au), platinum (Pt), nickel (Ni), copper (Cu), tungsten (W), and silver (Ag). Further, the lower electrode 14 may have a lamination structure of a metal film made of a simple substance or an alloy of the foregoing metal elements and a transparent conductive film structured by, for example, an alloy composed of an oxide of indium and tin (ITO)/InZnO (indium zinc oxide)/zinc oxide (ZnO) and aluminum (Al). In the case where the lower electrode 14 is used as an anode, the lower electrode 14 is desirably made of a material having high electron hole injection characteristics. If an appropriate electron hole injection layer is provided, it is able to use a material that has a disadvantage of a hole injection barrier due to existence of an oxide film on the surface and a small work function such as an aluminum (Al) alloy as the lower electrode 14.

The dividing wall 15 is intended to secure insulation between the lower electrode 14 and the upper electrode 17, and to obtain a desired shape of the light emitting region. In addition, the dividing wall 15 also functions as a dividing wall in coating by ink jet method or nozzle coating method in the after-mentioned manufacturing step. The dividing wall 15 has an upper dividing wall 15B made of a photosensitive resin such as positive type photosensitive polybenzoxazole and positive type photosensitive polyimide on a lower dividing wall 15A made of an inorganic insulating material such as $SiO_2$. The dividing wall 15 is provided with an aperture corresponding to a light emitting region. The organic layer 16 and the upper electrode 17 may be provided not only in the aperture but also on the dividing wall 15. However, it is only the aperture of the dividing wall 15 that emits light.

The organic layer 16 of the red organic EL device 10R has, for example, a structure in which a hole injection layer 16AR, a hole transport layer 16BR, a red light emitting layer 16CR, a blue light emitting layer 16CB, an electron transport layer 16D, and an electron injection layer 16E are layered sequentially from the lower electrode 14 side. The organic layer 16 of the green organic EL device 10G has, for example, a structure in which a hole injection layer 16AG, a hole transport layer 16BG, a green light emitting layer 16CG, the blue light emitting layer 16CB, the electron transport layer 16D, and the electron injection layer 16E are layered sequentially from the lower electrode 14 side. The organic layer 16 of the blue organic EL device 10B has, for example, a structure in which a hole injection layer 16AB, a hole transport layer 16BB, the blue light emitting layer 16CB, the electron transport layer 16D, and the electron injection layer 16E are layered sequentially from the lower electrode 14 side. Of the foregoing layers, the blue light emitting layer 16CB, the electron transport layer 16D, and the electron injection layer 16E are provided as a common layer for the red organic EL device 10R, the green organic EL device 10G, and the blue organic EL device 10B.

The hole injection layers 16AR, 16AG, and 16AB are intended to improve the hole injection efficiency and function as a buffer layer to prevent leakage. The hole injection layers 16AR, 16AG, and 16AB are provided on the lower electrode 14 respectively for the red organic EL device 10R, the green organic EL device 10G, and the blue organic EL device 10B.

The hole injection layers 16AR, 16AG, and 16AB preferably have, for example, a thickness from 5 nm to 100 nm both inclusive, and more preferably have a thickness from 8 nm to 50 nm both inclusive. The component material of the hole injection layers 16AR, 16AG, and 16AB may be selected as appropriate according to relation with a material of an electrode and a layer adjacent thereto. Examples thereof include polyaniline and a derivative thereof, polythiophene and a derivative thereof, polypyrrole and a derivative thereof, polyphenylene vinylene and a derivative thereof, polythienylene vinylene and a derivative thereof, polyquinoline and a derivative thereof, polyquinoxaline and a derivative thereof, a conductive polymer such as a polymer including an aromatic amine structure in a main chain or a side chain, metal phthalocyanine (copper phthalocyanine or the like), and carbon. In the case where the material used for the hole injection layers 16AR, 16AG, and 16AB is a polymer material, the weight average molecular weight (Mw) of the polymer is preferably from 2000 to 10000 both inclusive as an oligomer or in the range from 10000 to 30000 both inclusive. In particular, the weight average molecular weight (Mw) of the polymer is preferably from 5000 to 200000 both inclusive. If Mw is less than 5000, there is a possibility that the hole injection layer is dissolved in forming layers on and after the hole transport layer. Further, if Mw exceeds 300000, there is a possibility that the material is gelated and film formation becomes difficult.

Examples of typical conductive polymers used as the component material of the hole injection layers 16AR, 16AG, and 16AB include polyaniline and/or oligoaniline and polydioxythiophene such as poly(3,4-ethylenedioxythiophene) (PEDOT). Examples thereof include a polymer commercially available under the name of Nafion (trademark) made by H.C. starck, a polymer commercially available under the name of Liquion (trademark) in a dissolved state, EL source (trademark) made by Nissan Chemical Industries, Ltd., and Berazol (trademark) as a conductive polymer made by Soken Chemical & Engineering Co., Ltd.

The hole transport layers 16BR and 16BG of the red organic EL device 10R and the green organic EL device 10G are intended to improve hole transport efficiency to the red light emitting layer 16CR and the green light emitting layer 16CG. The hole transport layers 16BR and 16BG are provided on the hole injection layers 16AR and 16AG respectively for the red organic EL device 10R and the green organic EL device 10G.

The hole transport layers 16BR and 16BG preferably have, for example, a thickness from 10 nm to 200 nm both inclusive, and more preferably have a thickness from 15 nm to 150 nm both inclusive though the thickness depends on the device whole structure. Examples of polymer materials composing the hole transport layers 16BR and 16BG include a light emitting material dissolvable into an organic solvent such as polyvinyl carbazole and a derivative thereof, polyfluorene and a derivative thereof, polyaniline and a derivative thereof, polysilane and a derivative thereof, a polysiloxane derivative having an aromatic amine structure in a main chain or a side chain, polythiophene and a derivative thereof, and polypyrrole.

The weight average molecular weight (Mw) of the polymer material is preferably from 50000 to 300000 both inclusive, and in particular, is preferably from 100000 to 200000 both inclusive. If Mw is less than 50000, there is a possibility that in forming the light emitting layer, a low molecular component in the polymer material is dropped, and a dot is generated in the hole injection layer and the hole transport layer, and thus initial performance of the organic EL device may be lowered and the device may be deteriorated. Meanwhile, if Mw exceeds 300000, there is a possibility that the material is gelated and film formation becomes difficult. The weight average molecular weight (Mw) is a value obtained by finding the weight average molecular weight as a reduced quantity of polystyrene by gel permeation chromatography (GPC) with the use of tetrahydrofuran as a solvent.

The red light emitting layer 16CR and the green light emitting layer 16CG are intended to generate light due to electron-hole recombination by applying an electric field. The red light emitting layer 16CR and the green light emitting layer 16CG have, for example, a thickness from 10 nm to 200 nm both inclusive, and preferably have a thickness from 15 nm to 150 nm both inclusive though the thickness depends on the device whole structure. Examples of polymer light emitting materials composing the red light emitting layer 16CR and the green light emitting layer 16CG include a polyfluorene polymer derivative, a (poly)paraphenylenevinylene derivative, a polyphenylene derivative, a polyvinyl carbazole derivative, a polythiophene derivative, perylene pigment, coumarin pigment, rhodamine pigment, and a material obtained by doping an organic EL material into the foregoing polymer. For example, a substance obtained by doping rubrene, perylene, 9,10 diphenyl anthracene, tetraphenyl butadiene, nile red, and coumarin 6 is able to be used The hole transport layer 16BB of the blue organic EL device 10B is intended to improve hole transport efficiency to the blue light emitting layer 16CB. The hole transport layer 16BB is provided on the hole injection layer 16AB. The hole transport layer 16BB preferably has, for example, a thickness from 10 nm to 200 nm both inclusive, and more preferably has a thickness from 15 nm to 150 nm both inclusive though the thickness depends on the device whole structure.

The hole transport layer 16BB contains a low molecular material. Therefore, in the organic EL display unit, light emitting efficiency and life of blue are able to be improved. The low molecular material is a compound that is other than a substance composed of a high-molecular weight polymer or condensed body molecules generated by chain-like repetition of the same or similar reaction of the low molecular compound, and that has a single molecular weight substantively. Further, the low molecular material does not generate new chemical bond between molecules substantively by heating, and exists as a mono-molecule.

Specific examples of materials of the hole transport layer 16BB include benzine, styrilamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, a derivative thereof, and a heterocyclic conjugated monomer/oligomer/polymer such as a polysilane compound, a vinyl carbazole compound, a thiophene compound, and an aniline compound.

Specific examples of materials of the hole transport layer 16BB include α-naphtylphenylphenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenylphenylamino)triphenylamine, N,N,N'-N'-tetrakis(p-tolyl)p-phenylene diamine, N,N,N',N'-tetraphenyl-4,4'-diaminobiphenyl, N-phenylcarbazole, 4-di-p-tolylaminostylbene, poly(paraphenylenevinylene), poly(thiophenevinylene), and poly(2,2'-thienylpyrrol). However, the material of the hole transport layer 16BB is not limited thereto.

A material structured by using an organic material expressed by the following General formula 1 shown in following Chemical formula 1 is more preferable.

Chemical formula 1

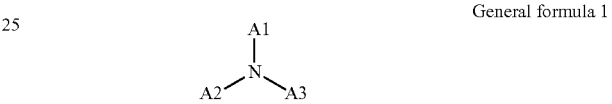

General formula 1

In General formula 1, A1 to A3 respectively and independently represent a substituted or unsubstituted aryl group or a substituted or unsubstituted heterocyclic group. Further, A1 to A3 may have an extension structure in which a plurality of rings is linked by conjugate bond respectively, but it is preferably that A1 to A3 have 30 or less carbon atoms in total. Further, examples of a substituted group bonded to the aryl group or the heterocyclic group include hydrogen, halogen, a hydroxyl group, a substituted or unsubstituted carbonyl group having 20 or less carbon atoms, a substituted or unsubstituted carbonylester group having 20 or less carbon atoms, a substituted or unsubstituted alkyl group having 20 or less carbon atoms, a substituted or unsubstituted alkenyl group having 20 or less carbon atoms, a substituted or unsubstituted alkoxyl group having 20 or less carbon atoms, a cyano group, a nitro group, and a substituted or unsubstituted amino group having 30 or less carbon atoms.

Specific examples of such organic materials include Compounds 1(1) to 1(60) shown in following Chemical formula 2 to Chemical formula 5.

Chemical formula 2
Compound 1(1) to Compound 1(17)

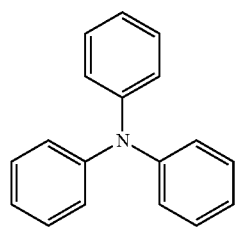

(1)-1

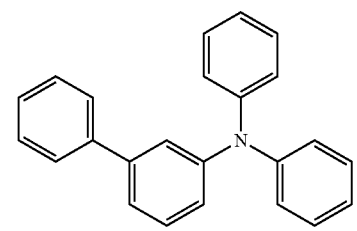

(1)-2

-continued
(1)-3
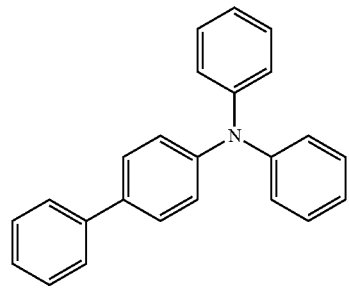
(1)-4
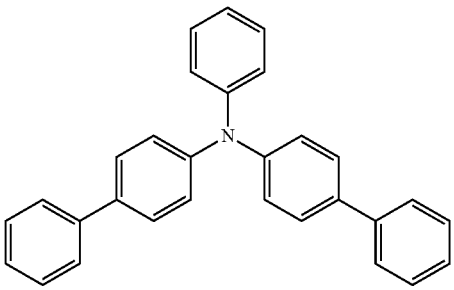
(1)-5
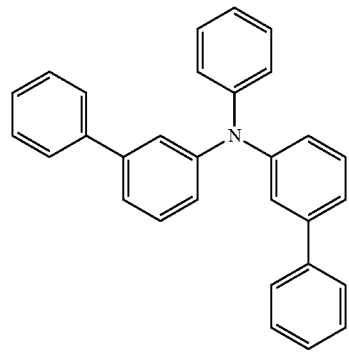
(1)-6
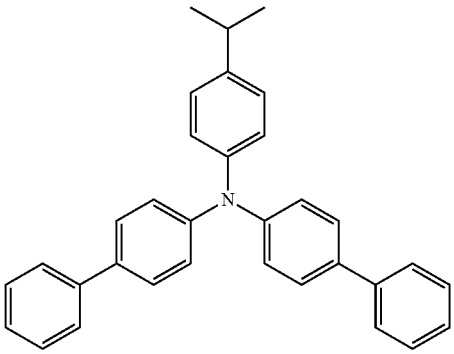
(1)-7
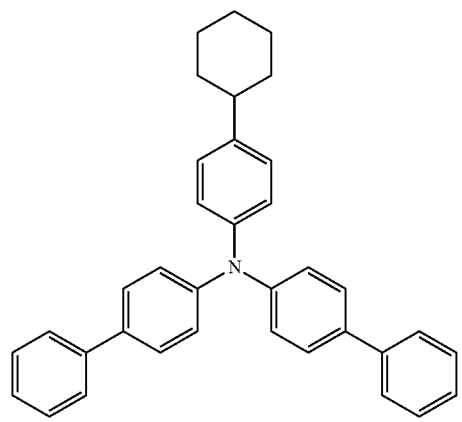
(1)-8
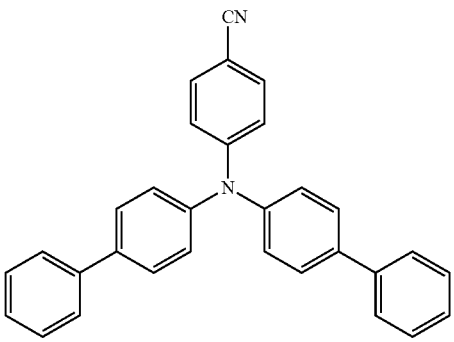
(1)-9
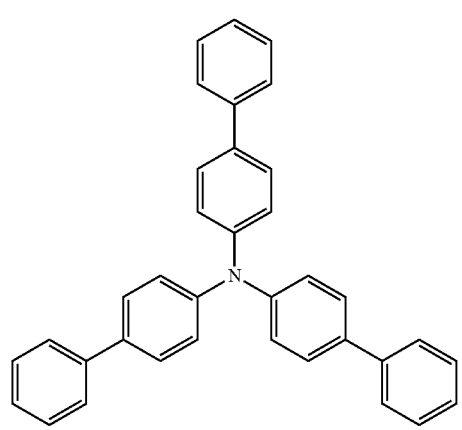
(1)-10
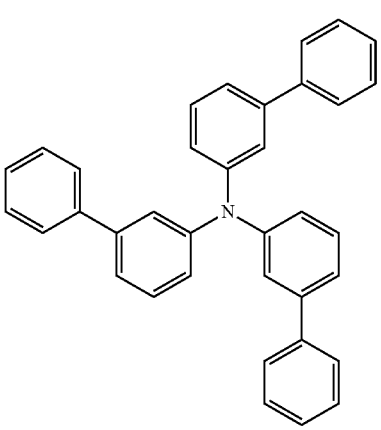

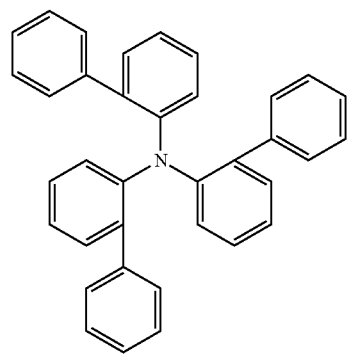
(1)-11
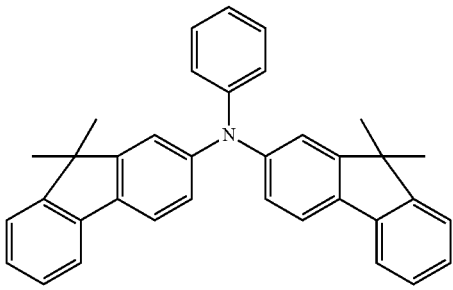
(1)-12
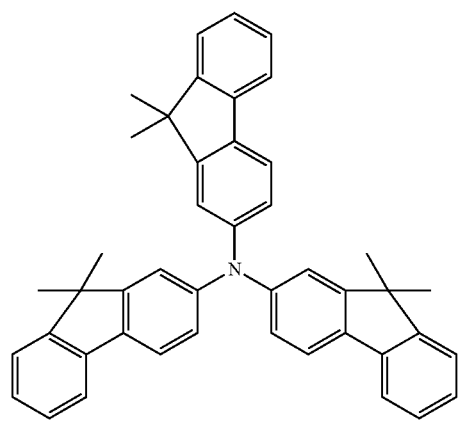
(1)-13
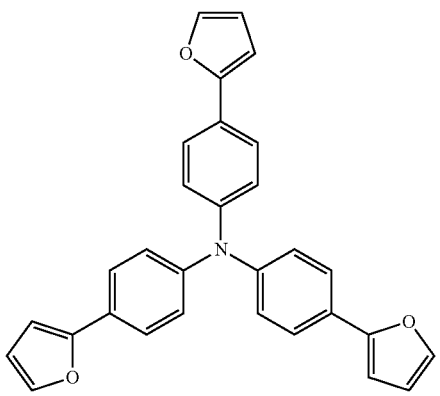
(1)-14
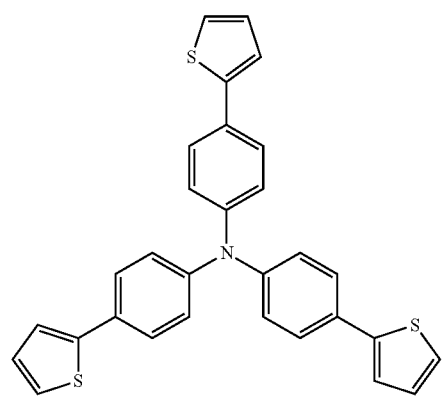
(1)-15
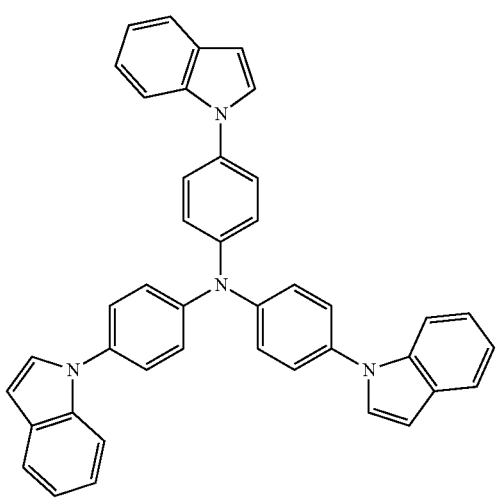
(1)-16

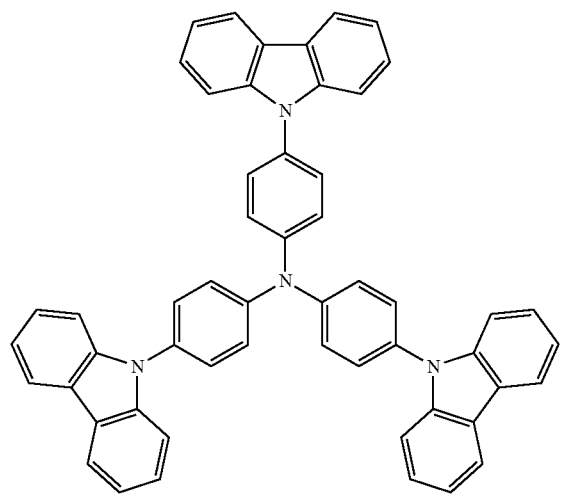
Chemical formula 3
Compound 1(18) to Compound 1(32)
(1)-17
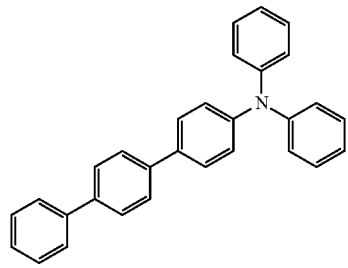
(1)-18
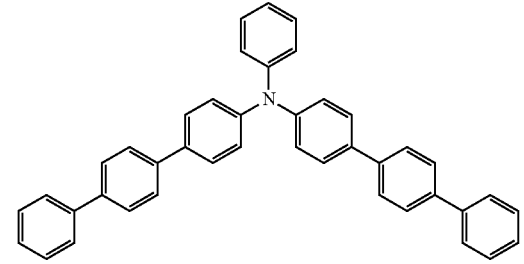
(1)-19
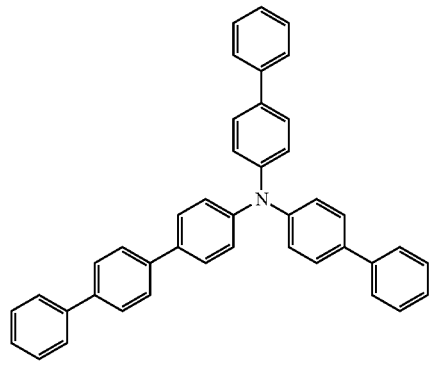
(1)-20
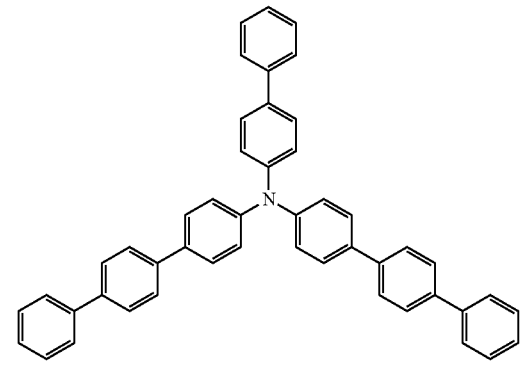
(1)-21
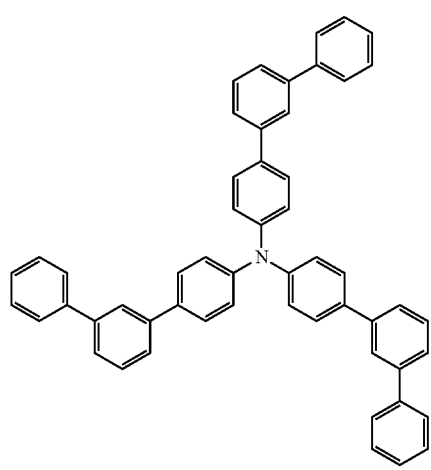
(1)-22
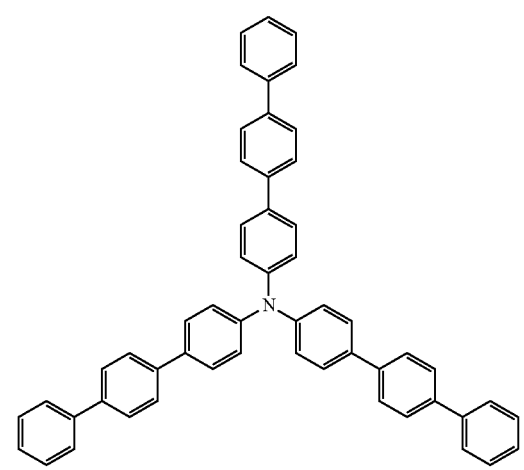
(1)-23

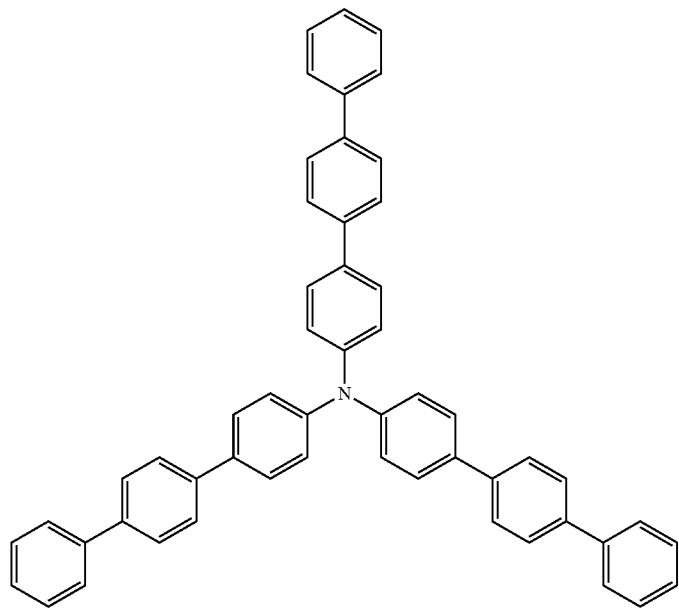
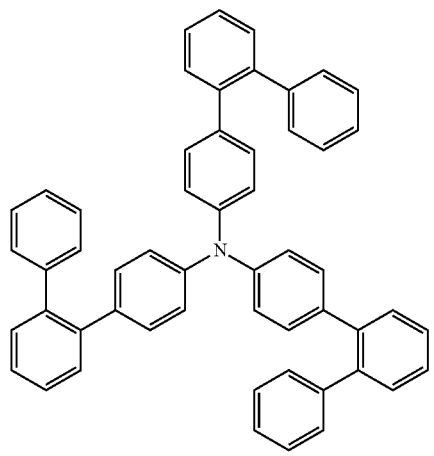
(1)-24
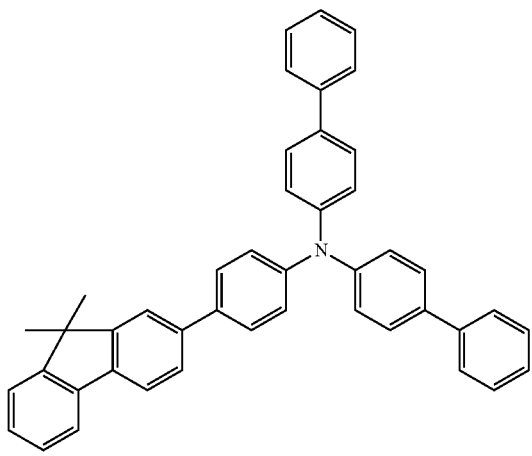
(1)-25
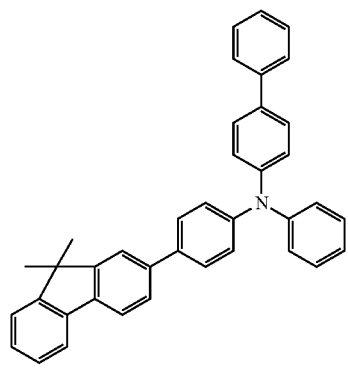
(1)-26
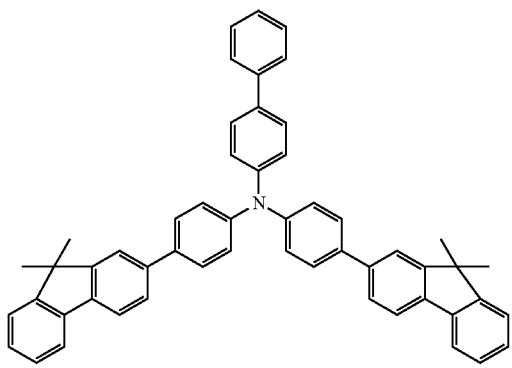
(1)-27

(1)-28
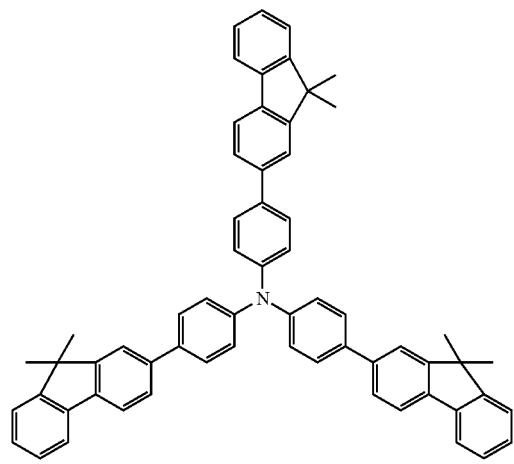
(1)-29
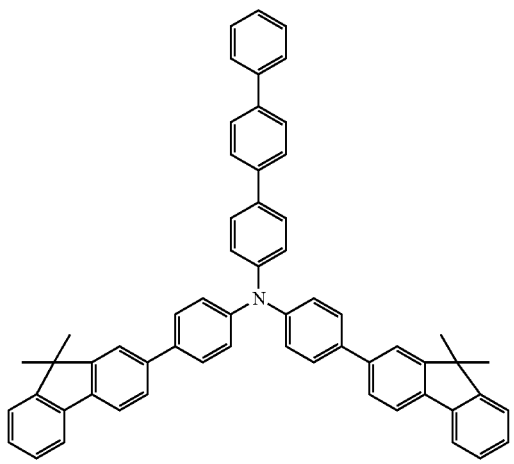
(1)-30
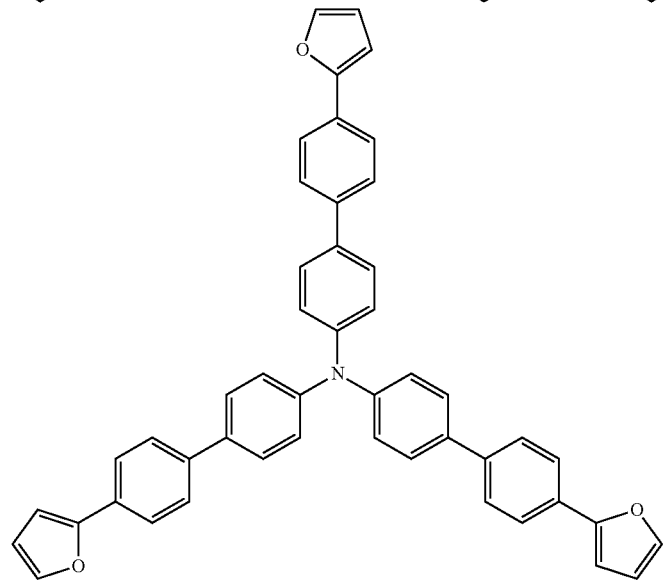
(1)-31
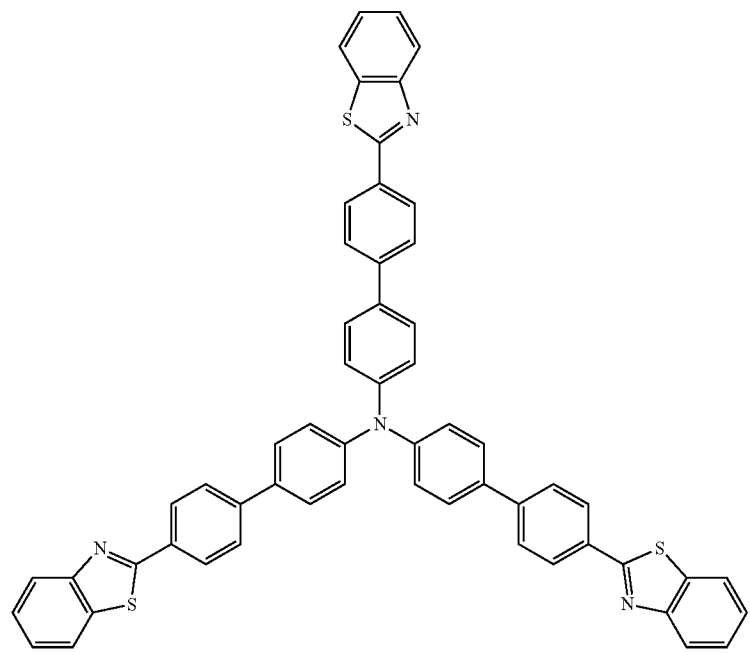

(1)-32
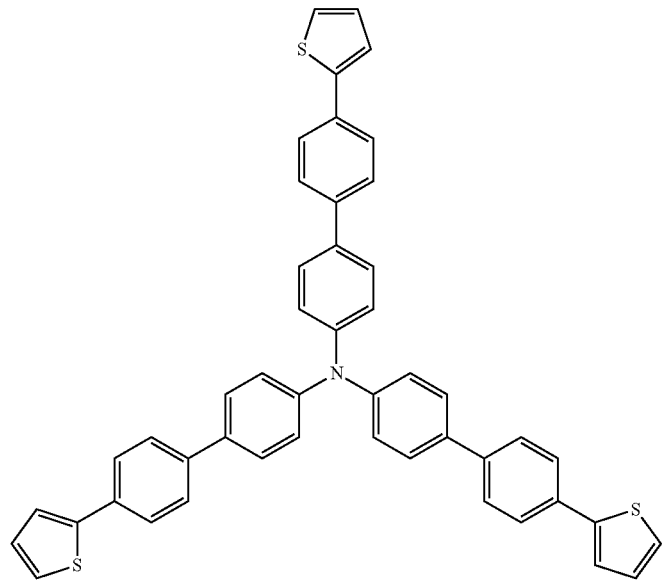
Chemical formula 4
Compound 1(33) to Compound 1(48)
(1)-33
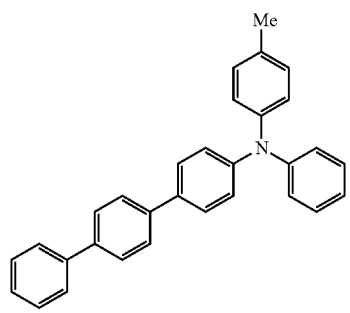
(1)-34
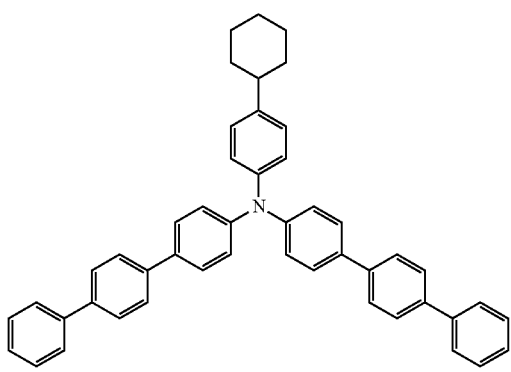
(1)-35
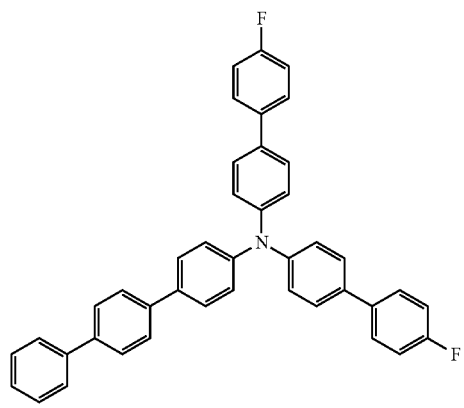
(1)-36
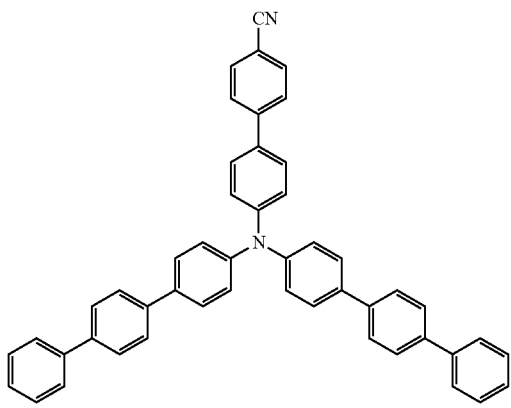

-continued
(1)-37
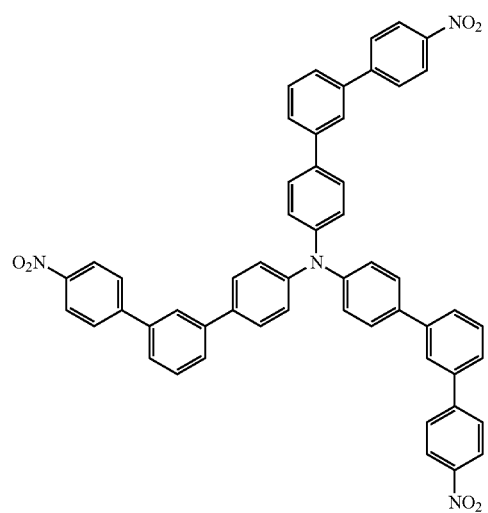
(1)-38
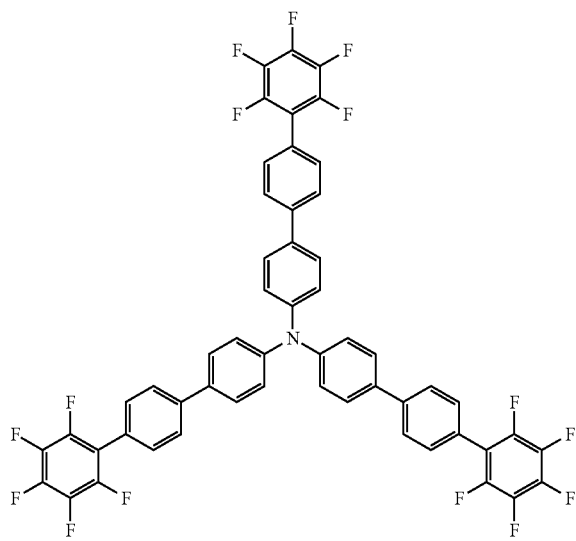
(1)-39
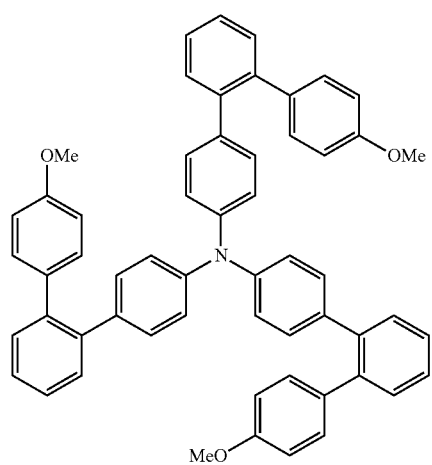
(1)-40
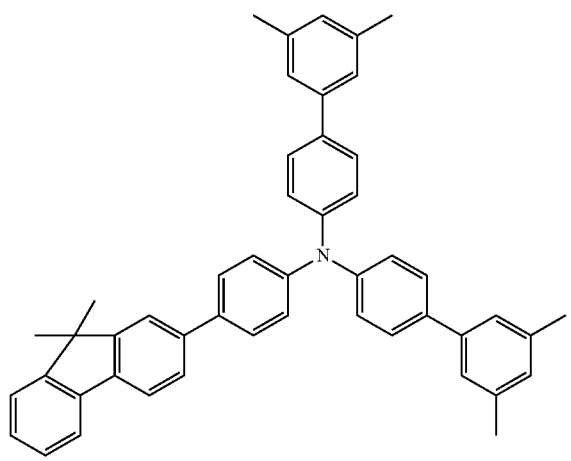
(1)-40
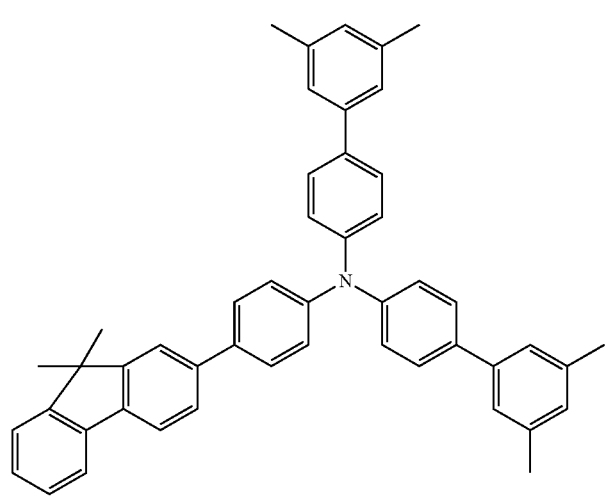

-continued
(1)-41
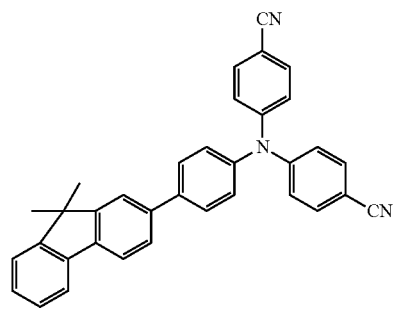
(1)-42
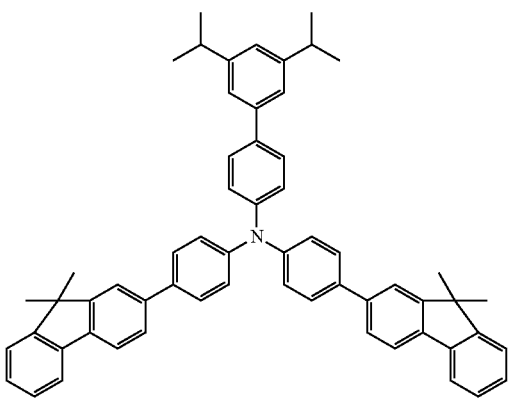
(1)-43
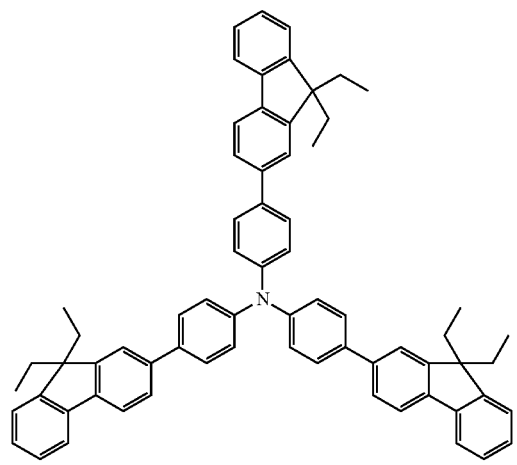
(1)-44
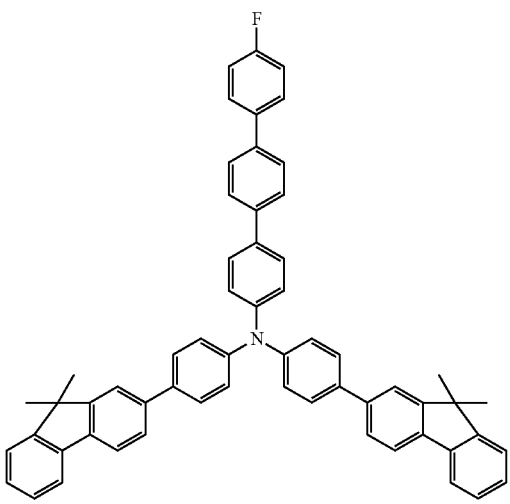
(1)-43
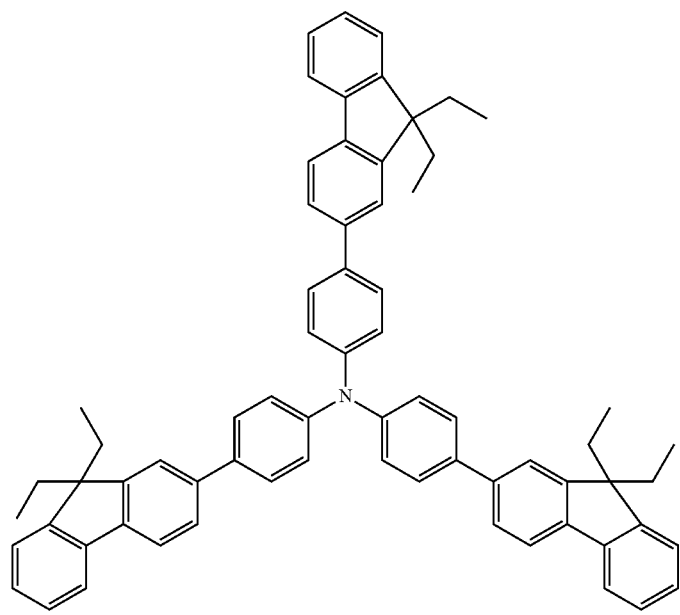

-continued
(1)-45
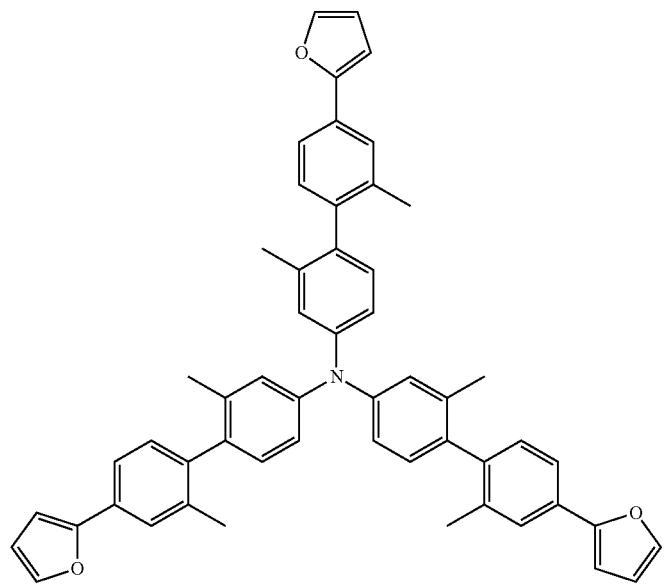
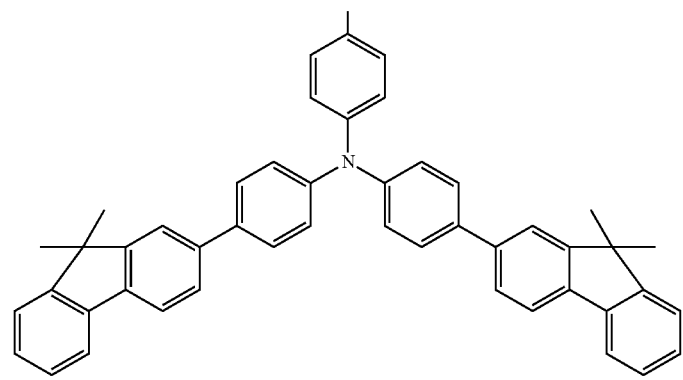
(1)-46
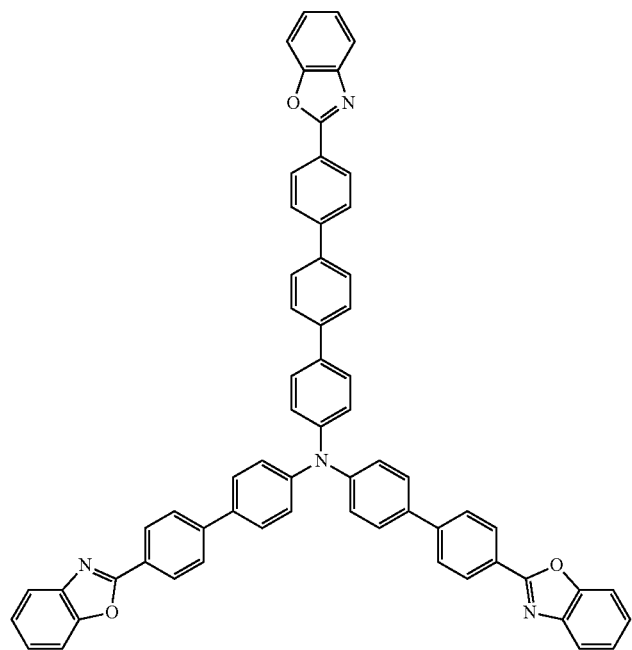

-continued
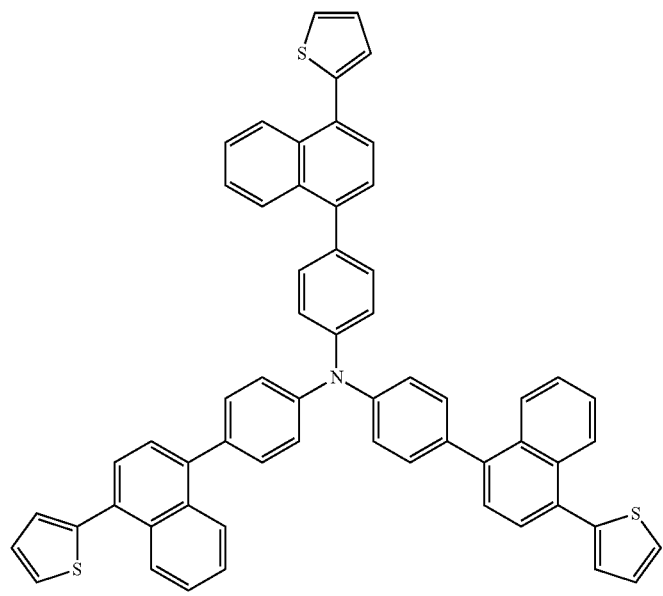
(1)-47
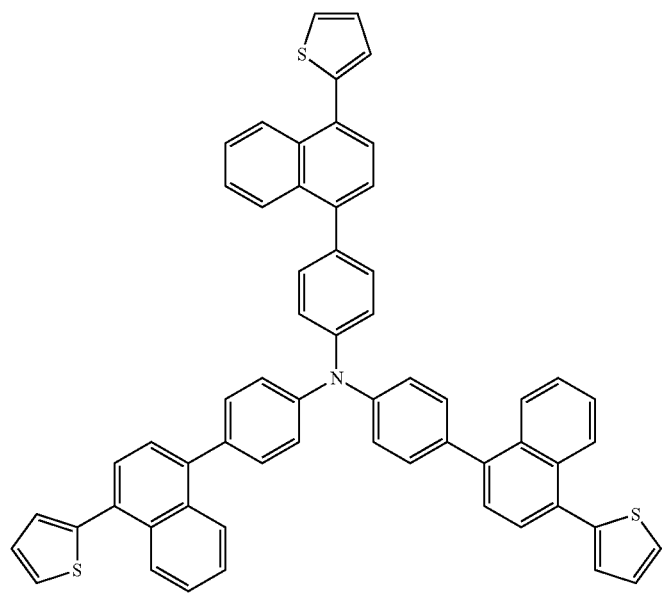
(1)-47

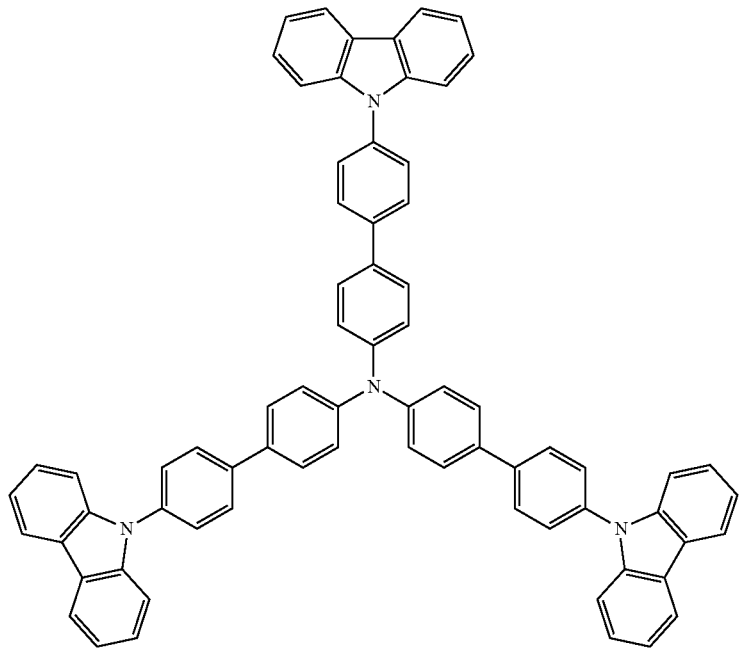
(1)-48
Chemical formula 5
Compound 1(49) to Compound 1(60)
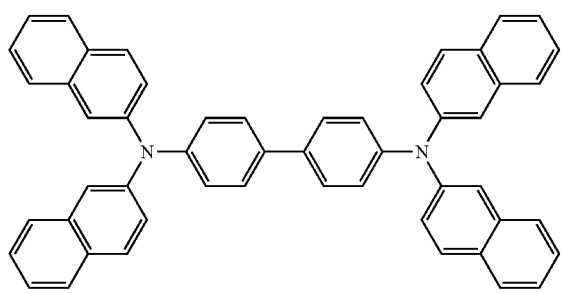
(1)-49
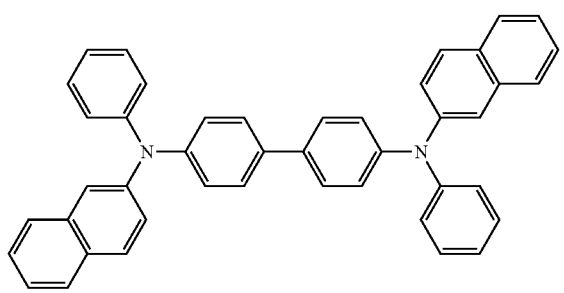
(1)-50
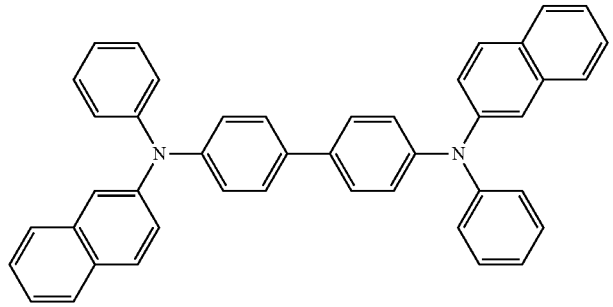
1-(50)

-continued

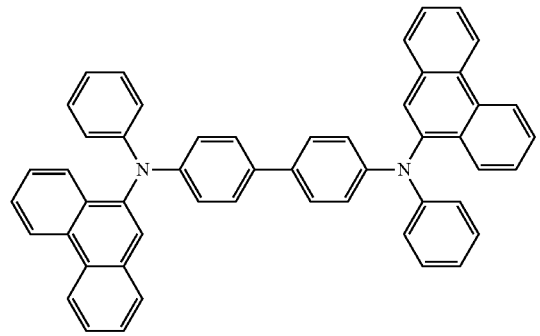
(1)-51

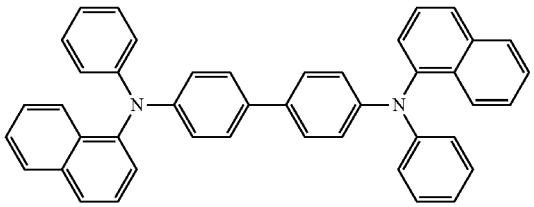
(1)-52

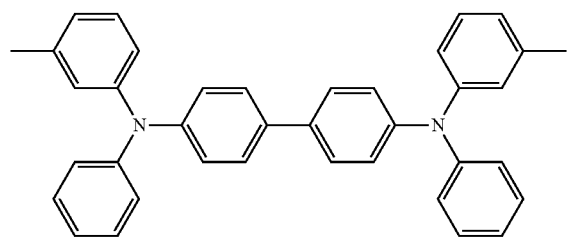
(1)-53

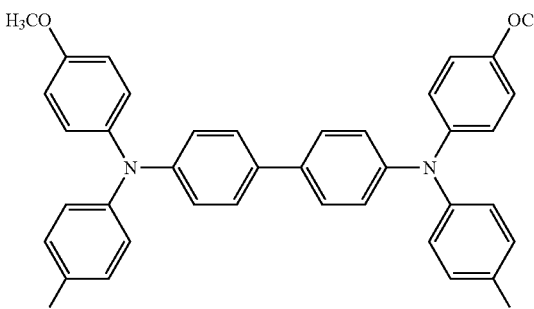
(1)-54

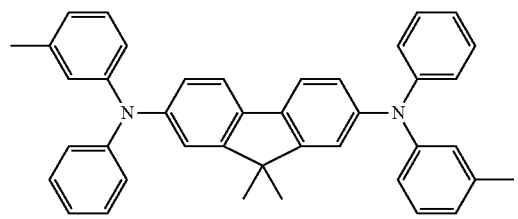
(1)-55

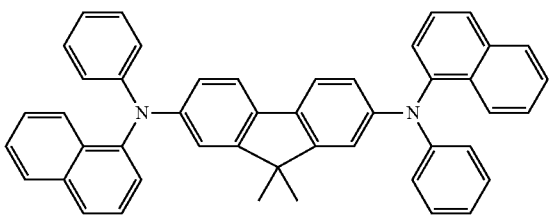
(1)-56

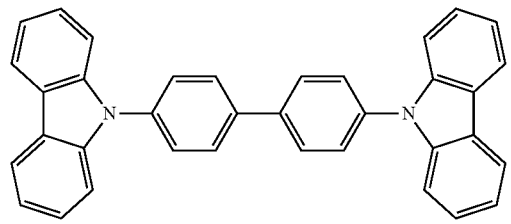
(1)-57

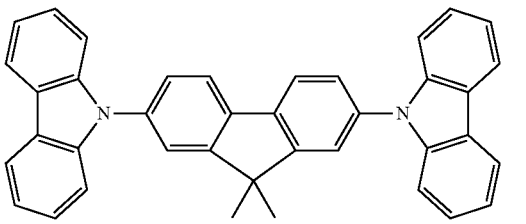
(1)-58

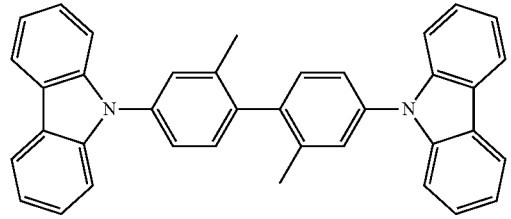
(1)-59

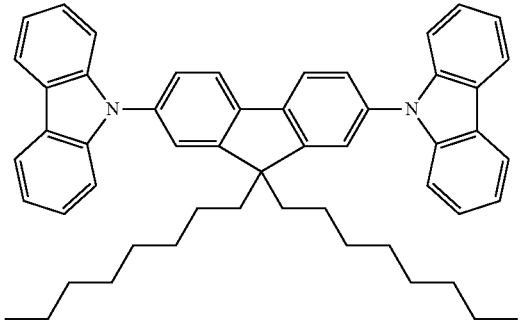
(1)-60

The blue light emitting layer 16CB is intended to generate light due to electron-hole recombination by being applied an electric field. The blue light emitting layer 16CB is provided as a common layer on the whole area of the red light emitting layer 16CR, the green light emitting layer 16CG, and the hole transport layer 16BB for the blue organic EL device 10B. The blue light emitting layer 16CB is structured so that a guest material of blue or green fluorescent pigment is doped with the use of an anthracene compound as a host material. The blue light emitting layer 16CB emits blue or green light.

The host material composing the blue light emitting layer 16CB is preferably an anthracene derivative expressed by General formula 2 shown in following Chemical formula 6.

Chemical formula 6

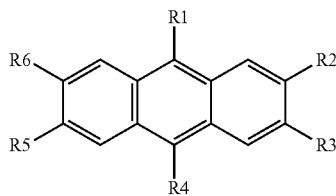

General formula 2

In General formula 2, R1 to R6 respectively and independently represent hydrogen, halogen, a hydroxyl group, a substituted or unsubstituted carbonyl group having 20 or less carbon atoms, a substituted or unsubstituted carbonylester group having 20 or less carbon atoms, a substituted or unsubstituted alkyl group having 20 or less carbon atoms, a substituted or unsubstituted alkenyl group having 20 or less carbon atoms, a substituted or unsubstituted alkoxyl group having 20 or less carbon atoms, a cyano group, a nitro group, a substituted or unsubstituted silyl group having 30 or less carbon atoms, a substituted or unsubstituted aryl group having 30 or less carbon atoms, a substituted or unsubstituted heterocyclic group having 30 or less carbon atoms, or a substituted or unsubstituted amino group having 30 or less carbon atoms.

Examples of the aryl group represented by R1 to R6 in General formula 2 include a phenyl group, a 1-naphtyl group, a 2-naphtyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-crycenyl group, a 6-crycenyl group, a 2-fluoranethenyl group, a 3-fluoranethenyl group, a 2-biphenylyl group, a 3-biphenylyl group, a 4-biphenylyl group, an o-tolyl group, an m-tolyl group, a p-tolyl group, and a p-t-butylphenyl group.

Examples of the heterocyclic group represented by R1 to R6 in General formula 2 include a five-membered ring or a six-membered ring aromatic heterocyclic group containing O, N, and S as a hetero atom and a condensed polycyclic aromatic heterocyclic group having 2 to 20 carbon atoms. Further, examples of the aromatic heterocyclic group and the condensed polycyclic aromatic heterocyclic group include a thienyl group, a furyl group, a pyrrolyl group, a pyridyl group, a quinolyl group, a quinoxalil group, an imidazopyridyl group, and a benzothiazole group. Representative examples thereof include a 1-pyrrolyl group, a 2-pyrrolyl group, a 3-pyrrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanslidinyl group, a 2-phenanslidinyl group, a 3-phenanslidinyl group, a 4-phenanslidinyl group, a 6-phenanslidinyl group, a 7-phenanslidinyl group, an 8-phenanslidinyl group, a 9-phenanslidinyl group, a 10-phenanslidinyl group, a 1-acrydinyl group, a 2-acrydinyl group, a 3-acrydinyl group, a 4-acrydinyl group, and a 9-acrydinyl group.

The amino group represented by R1 to R6 may be any of an alkylamino group, an arylamino group, and an aralkylamino group. Such groups preferably have an aliphatic carbon ring having 1 to 6 carbon atoms in total and/or a monocyclic to tetracyclic aromatic carbon ring. Examples thereof include a dimethylamino group, a diethylamino group, a dibutylamino group, a diphenylamino group, a ditrylamino group, a bisbiphenyl amino group, and dinaphthylamino group.

Two or more of the foregoing substituted groups may form a condensed ring, and may further have a substituted group.

Specific examples of the compound include compound 2(1) to 2(51) shown in following Chemical formula 7 to Chemical formula 9.

Chemical formula 7
Compound 2(1) to Compound 2(18)

(2)-1

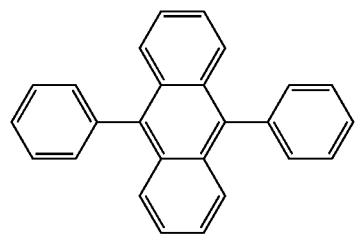

(2)-2

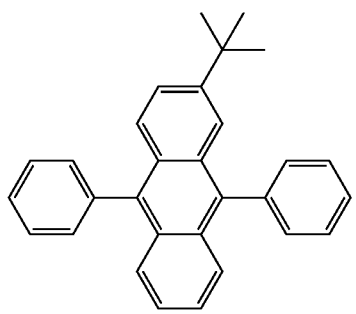

-continued
(2)-3
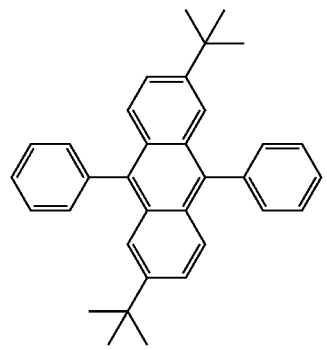
(2)-4
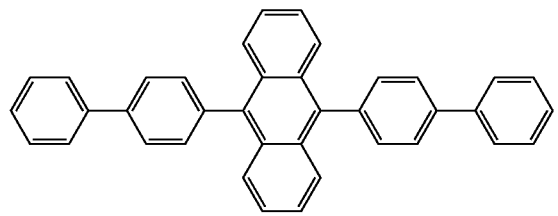
(2)-5
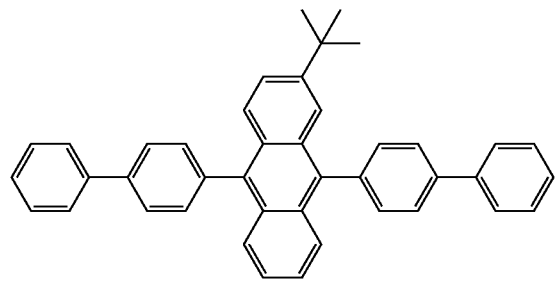
(2)-6
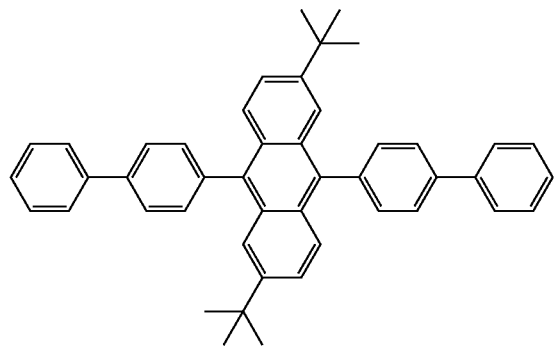
(2)-7
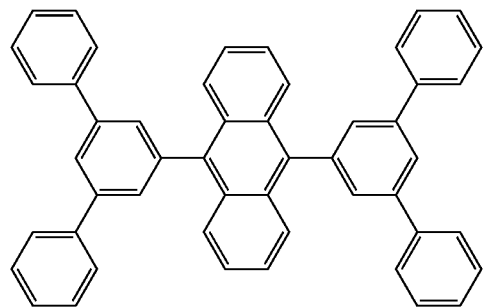
(2)-8
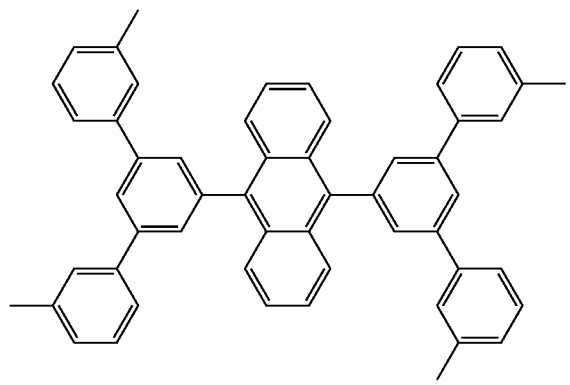
(2)-9
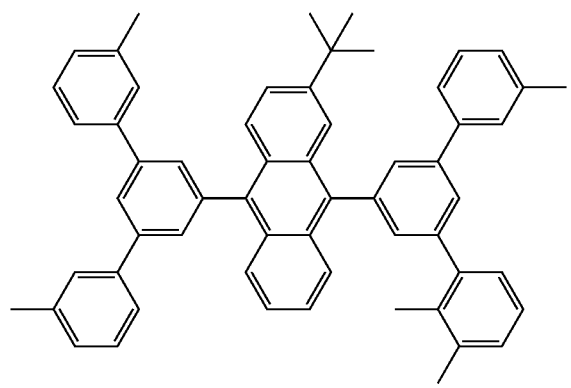
(2)-10
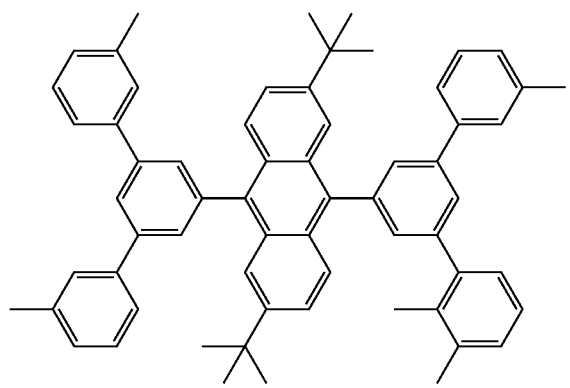

(2)-11
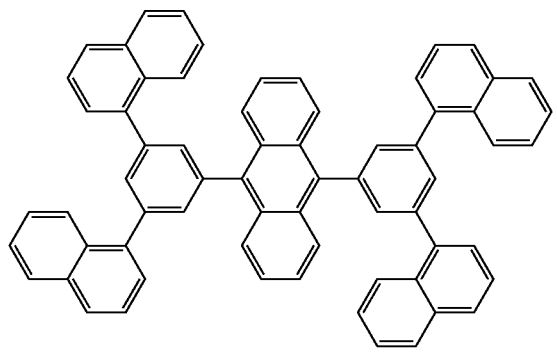
(2)-12
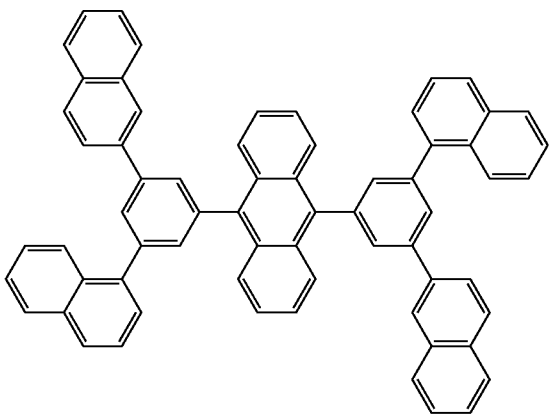
(2)-13
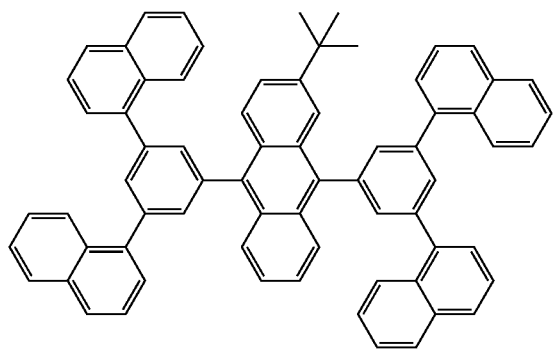
(2)-14
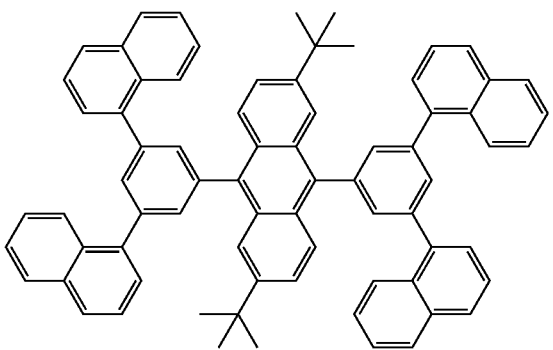
(2)-15
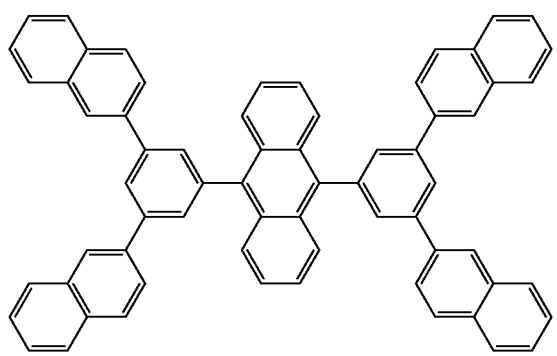
(2)-16
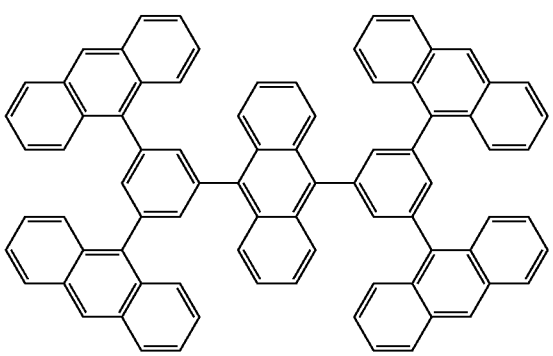

(2)-17
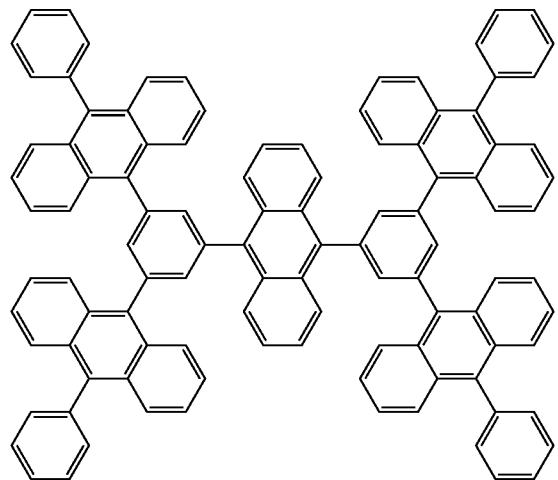
(2)-18
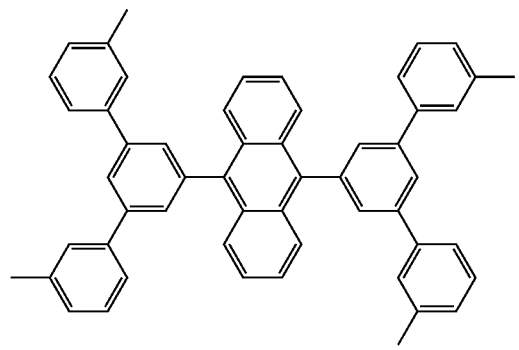
Chemical formula 8
Compound 2(19) to Compound 2(36)
(2)-19
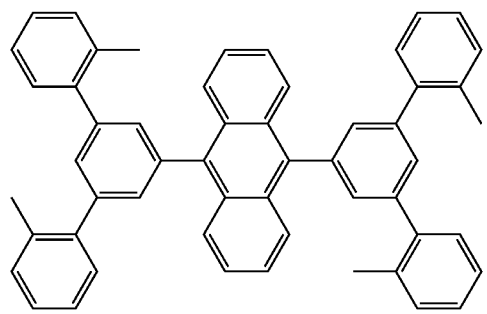
(2)-20
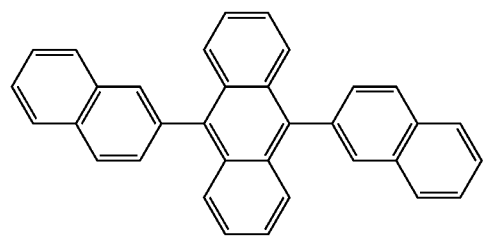
(2)-21
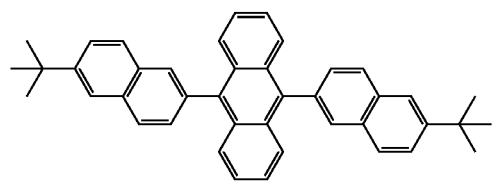
(2)-22
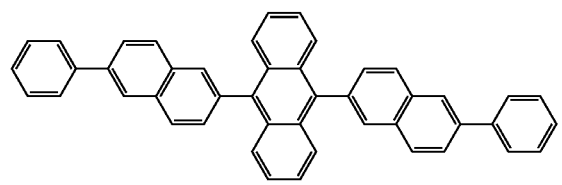
(2)-23
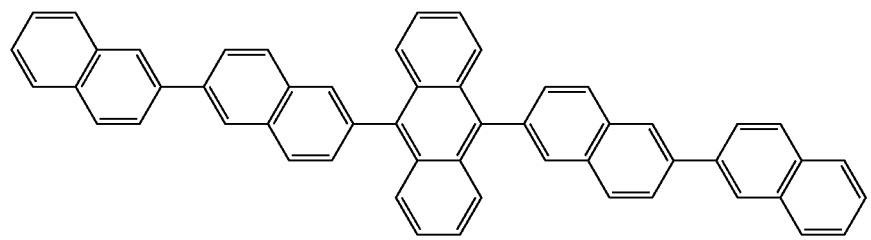
(2)-24
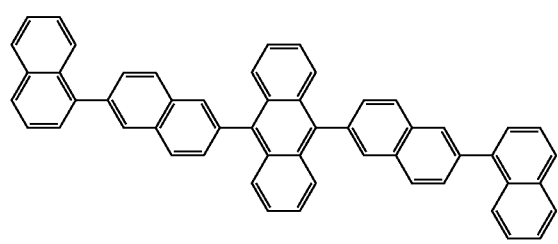
(2)-25
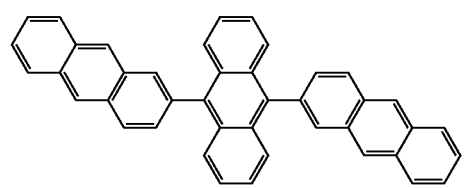

-continued
(2)-26
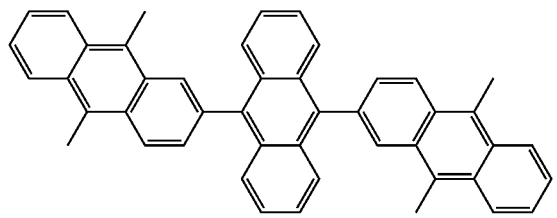
(2)-27
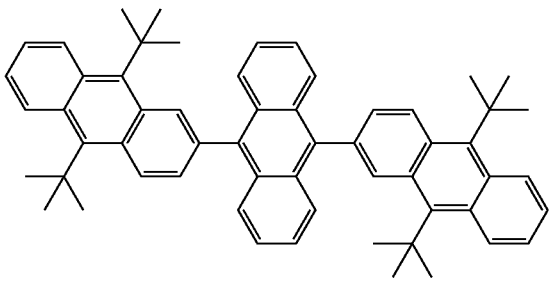
(2)-28
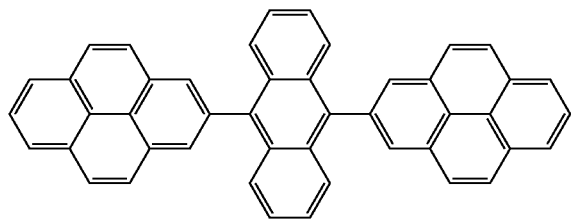
(2)-29
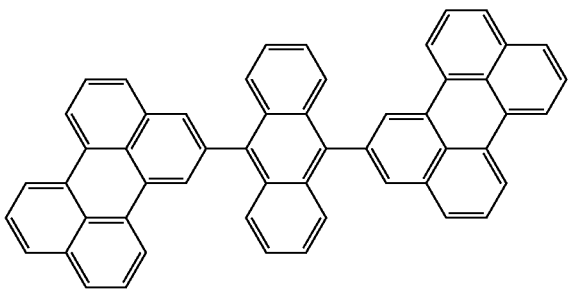
(2)-30
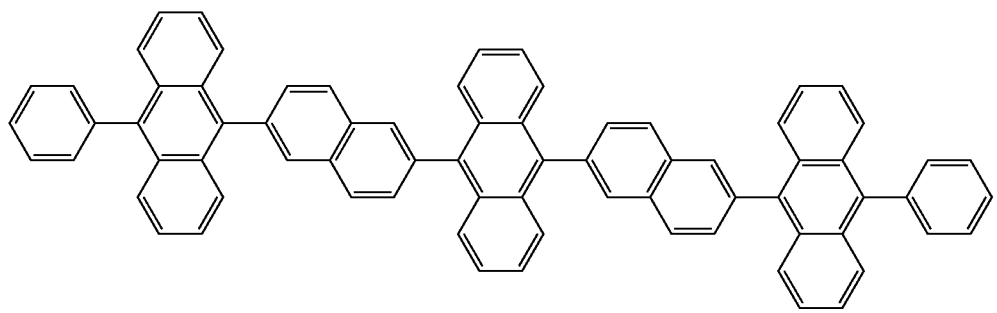
(2)-31
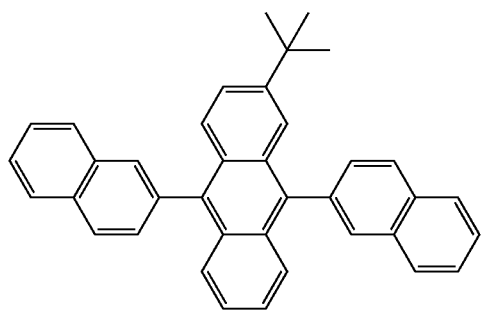
(2)-32
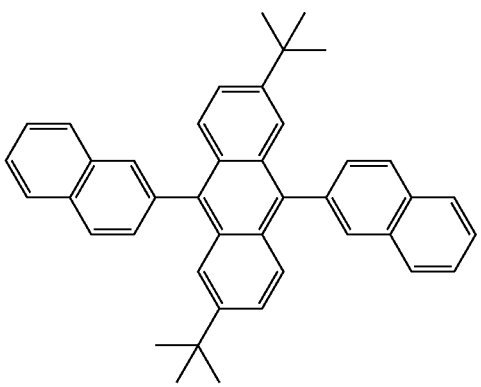
(2)-33
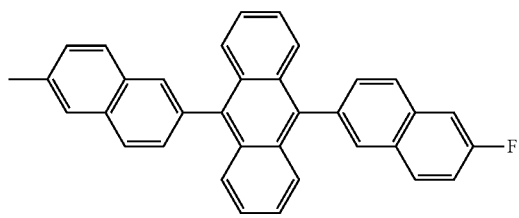
(2)-34
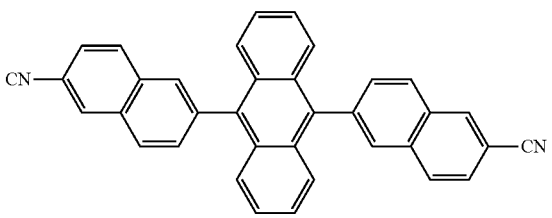

-continued
(2)-35
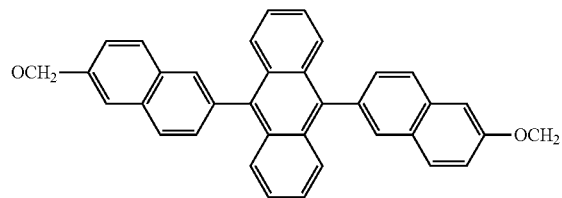
(2)-36
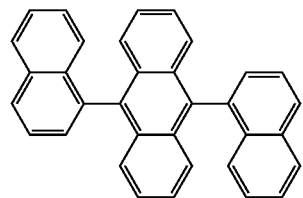
Chemical formula 9
Compound 2(37) to Compound 2(51)
(2)-37
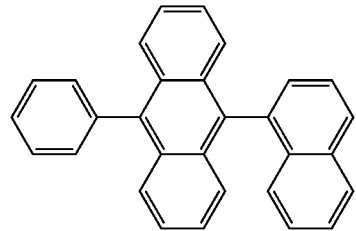
(2)-38
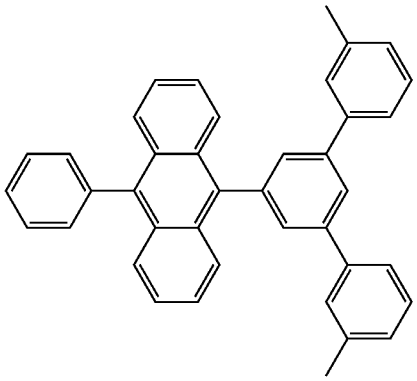
(2)-39
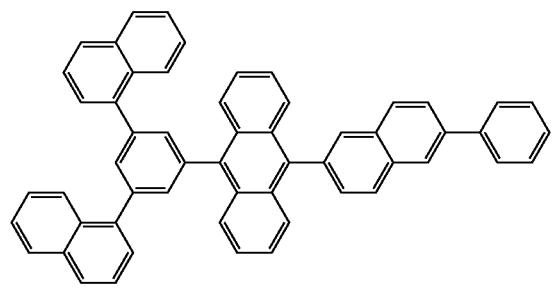
(2)-40
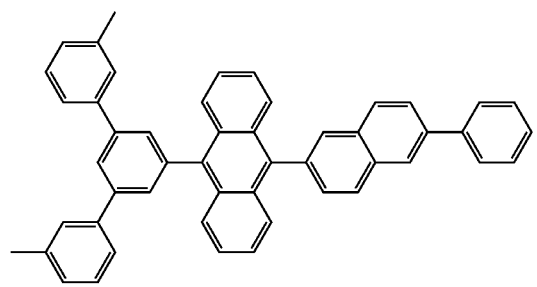
(2)-41
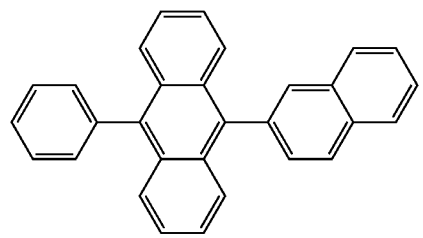
(2)-42
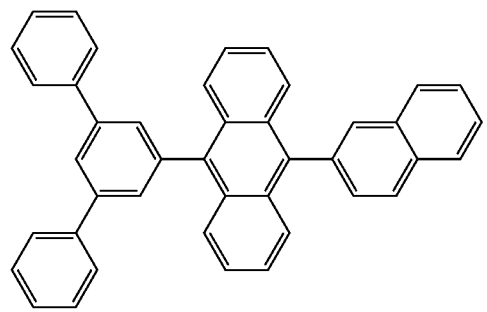
(2)-43
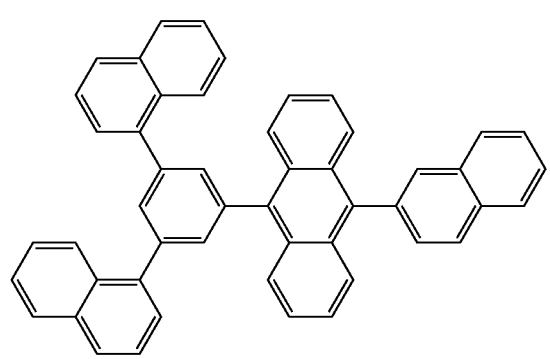
(2)-44
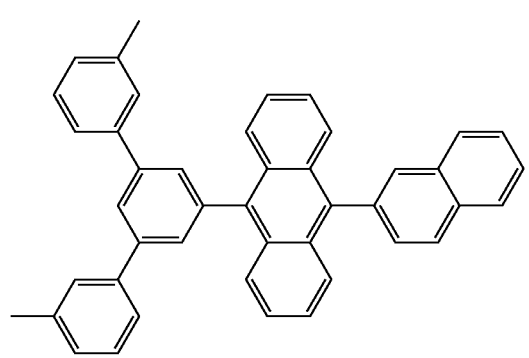

-continued (2)-45
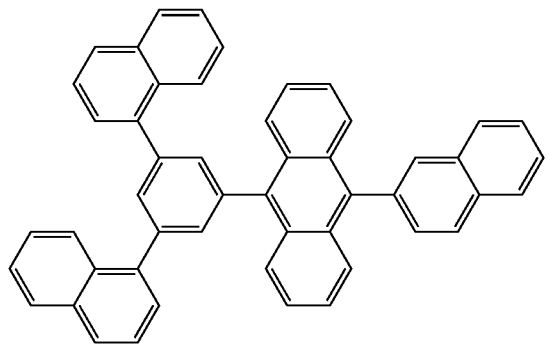

(2)-46
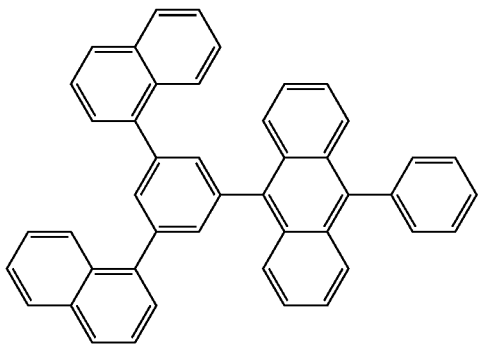

(2)-47
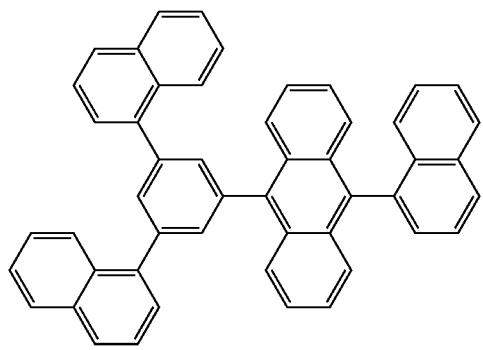

(2)-48
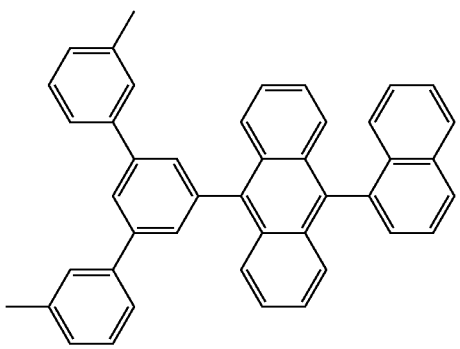

(2)-49
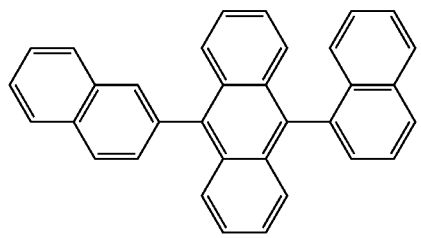

(2)-50
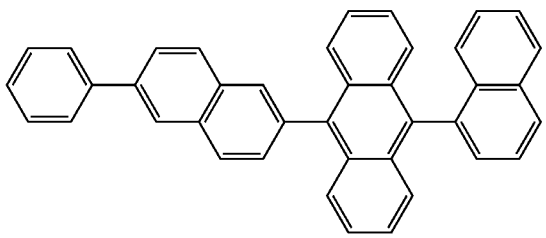

(2)-51
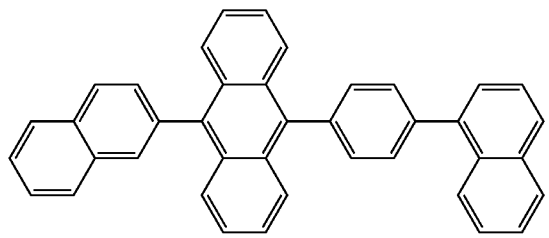

Meanwhile, as the light-emitting guest material composing the blue light emitting layer 16CB, a material having high light emitting efficiency such as a low molecular fluorescent material and a phosphorescence pigment, or an organic light emitting material such as a metal complex is used.

The light emitting guest material of blue means a compound in which the light emitting wavelength range shows the peak in the range about from 400 nm to 490 nm. As such a compound, an organic material such as a naphthalene derivative, an anthracene derivative, a naphthacene derivative, a styrilamine derivative, and a bis(adinyl)methene boron complex is used. Specially, it is preferable to select a compound from an aminonaphthalene derivative, an aminoanthracene derivative, an aminochrysene derivative, an aminopyrene derivative, a styrylamine derivative, and a bis(adinyl)methene boron complex.

The electron transport layer 16D is intended to improve electron transport efficiency to the red light emitting layer 16CR, the green light emitting layer 16CG, and the blue light emitting layer 16CB. The electron transport layer 16D is provided on the whole area of the blue light emitting layer 16CB as a common layer. Examples of material of the electron transport layer 16D include quinoline, perylene, phenanthroline, bisstyril, pyradine, triazole, oxazole, fullerene, oxadiazole, and fluorenone or a derivative and a metal complex thereof. Specific examples thereof include tris(8-hydroxyquinoline)aluminum (abbreviated to Alq$_3$), anthracene, naphthalene, phenanthrene, pyrene, anthracene, perylene, butadiene, coumarin, C60, acridine, stilbene, 1,10-phenanthroline, and a derivative and a metal complex thereof.

The electron injection layer 16E is intended to improve electron injection efficiency. The electron injection layer 16E is provided on the whole area of the electron transport layer 16D as a common layer. Examples of material of the electron injection layer 16E include lithium oxide ($Li_2O$) as an oxide of lithium (Li), cesium carbonate ($Cs_2CO_3$) as a composite oxide of cesium (Cs), and a mixture of the oxide/the composite oxide. Further, the material of the electron injection layer 16 is not limited to the foregoing material. For example, an alkali earth metal such as calcium (Ca) and barium (Ba), an alkali metal such as lithium and cesium, a metal having small work function such as indium (In) and magnesium (Mg), an oxide/a composite oxide/a fluoride of these metals as a simple body or a mixture/an alloy of the metal/the oxide/the composite oxide/the fluoride may be used by improving stability.

The upper electrode 17 has a thickness of, for example, from 3 nm to 8 nm both inclusive, and is made of a metal conductive film. Specific examples thereof include an alloy of aluminum (Al), magnesium (Mg), calcium (Ca), or sodium (Na). Specially, an alloy of magnesium and silver (Mg—Ag alloy) is preferable, since the Mg—Ag alloy has electric conductivity and small absorption in a thin film. The ratio of magnesium and silver in the Mg—Ag alloy is not particularly limited, but the film thickness ratio of Mg:Ag is desirably in the range from 20:1 to 1:1. Further, the material of the upper electrode 17 may be an alloy of aluminum (Al) and lithium (Li) (Al—Li alloy).

Further, the upper electrode 17 may be a mixed layer containing an organic light emitting material such as an aluminum quinoline complex, a styrylamine derivative, and a phthalocyanine derivative. In this case, the upper electrode 17 may further separately have a layer having light transmittance such as MgAg as the third layer. In the case of active matrix drive system, the upper electrode 17 is formed as a film in a solid state over the substrate 11 in a state of being insulated from the lower electrode 14 by the organic layer 16 and the dividing wall 15, and is used as a common electrode for the red organic EL device 10R, the green organic EL device 10G, and the blue organic EL device 10B.

The protective layer 20 has a thickness of, for example, from 2 μm to 3 μm both inclusive, and may be made of one of an insulating material and a conductive material. Preferable examples of the insulating material include an inorganic amorphous insulating material such as amorphous silicon (α-Si), amorphous silicon carbide (α-SiC), amorphous silicon nitride (α-Si1-xNx), and amorphous carbon (α-C). Such an inorganic amorphous insulating material does not structure grains, and thus the water permeability is low and forms a favorable protective film.

The sealing substrate 40 is located on the upper electrode 17 side of the red organic EL device 10R, the green organic EL device 10G, and the blue organic EL device 10B. The sealing substrate 40 seals the red organic EL device 10R, the green organic EL device 10G, and the blue organic EL device 10B together with the adhesive layer (not illustrated). The sealing substrate 40 is made of a material such as glass transparent to light generated in the red organic EL device 10R, the green organic EL device 10G, and the blue organic EL device 10B. The sealing substrate 40 is, for example, provided with a color filter and a light shielding film as a black matrix (both not illustrated), which extracts the light generated in the red organic EL device 10R, the green organic EL device 10G, and the blue organic EL device 10B, and absorbs outside light reflected by the red organic EL device 10R, the green organic EL device 10G, and the blue organic EL device 10B and the wiring in between to improve contrast.

The color filter has a red filter, a green filter, and a blue filter (all not illustrated), which are sequentially arranged correspondingly to the red organic EL device 10R, the green organic EL device 10G, and the blue organic EL device 10B. The red filter, the green filter, and the blue filter are respectively formed in the shape of, for example, a rectangle with no space in between. The red filter, the green filter, and the blue filter are respectively made of a resin mixed with a pigment. Adjustment is made by selecting a pigment so that light transmittance in the intended red, green, or blue wavelength region is high, and light transmittance in the other wavelength regions is low.

Further, the wavelength range with high transmittance in the color filter corresponds with a peak wavelength λ of spectrum of light that is desired to be extracted from a resonator structure MC1. Therefore, out of outside light entering from the sealing substrate 40, only outside light having a wavelength equal to the peak wavelength λ of the spectrum of the light that is desired to be extracted is transmitted through the color filter. Outside light having the other wavelength is prevented from intruding into the organic EL devices 10R, 10G, and 10B.

The light shielding film is composed of a black resin film having an optical density of 1 or more in which a black colorant is mixed or a thin film filter by using thin film interference. Of the foregoing, the light shielding film is preferably composed of the black resin film, since thereby the film is able to be formed inexpensively and easily. The thin film filter is obtained by layering one or more thin films composed of a metal, a metal nitride, or a metal oxide, and is intended to attenuate light by using thin film interference. Specific examples of the thin film filter include a filter in which chromium and chromium oxide (III) ($Cr_2O_3$) are alternately layered.

The organic EL display unit is able to be manufactured, for example, as follows.

Figure 4:
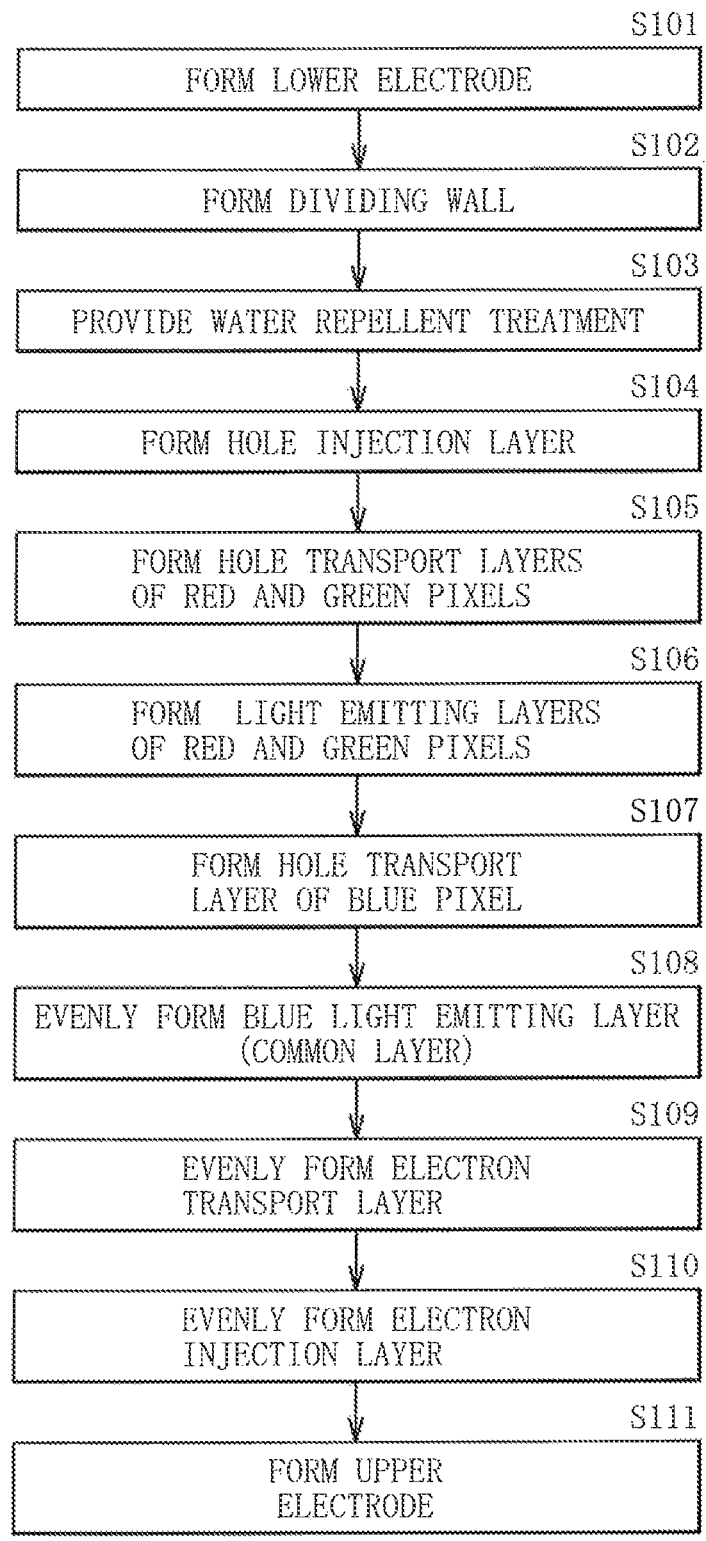
FIG. 4 is a chart illustrating a flow of a method of manufacturing the organic EL display unit illustrated in FIG. 1.

FIG. 4 illustrates a flow of a method of manufacturing the organic EL display unit. FIG. 5A to FIG. 7C illustrate the method of manufacturing the organic EL display unit illustrated in FIG. 4 in order of steps. First, the pixel drive circuit 140 including the drive transistor Tr1 is formed on the substrate 11 made of the foregoing material, and the planarizing insulating film (not illustrated) made of, for example, a photosensitive resin is provided.

Step of Forming the Lower Electrode 14

Figure 5A:
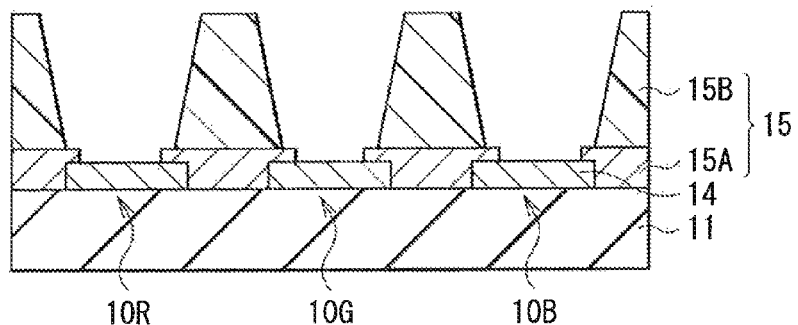
FIGS. 5A to 5C are cross sectional views illustrating the manufacturing method illustrated in FIG. 4 in order of steps.

Next, a transparent conductive film made of, for example, ITO is formed on the whole area of the substrate 11. The transparent conductive film is patterned and therefore, as illustrated in FIG. 5A, the lower electrode 14 is formed respectively for the red organic EL device 10R, the green organic EL device 10G, and the blue organic EL device 10B (step S101). At this time, the lower electrode 14 is conducted to the drain electrode of the drive transistor Tr1 through a contact hole (not illustrated) of the planarizing insulating film (not illustrated).

Step of Forming the Dividing Wall 15

Subsequently, as illustrated in FIG. 5A again, an inorganic insulating material such as $SiO_2$ is deposited on the lower electrode 14 and the planarizing insulating film (not illustrated) by, for example, CVD (Chemical Vapor Deposition) method. The resultant is patterned by using photolithography technology and etching technology, and therefore the lower dividing wall 15A is formed.

Thereafter, as illustrated in FIG. 5A again, the upper dividing wall 15B made of the foregoing photosensitive resin is formed in a given position of the lower dividing wall 15A, more specifically in a position surrounding the light emitting region of a pixel. Therefore, the dividing wall 15 composed of the lower dividing wall 15A and the upper dividing wall 15B is formed (step S102).

After the dividing wall 15 is formed, surface on the side where the lower electrode 14 and the dividing wall 15 are formed on the substrate 11 is treated with oxygen plasma. Contamination such as an organic material adhered to the surface is removed to improve wetting characteristics. Specifically, the substrate 11 is heated up to, for example, about 70 degrees centigrade to 80 degrees centigrade, and is subsequently treated with plasma ($O_2$ plasma treatment) with the use of oxygen as reaction gas under atmospheric pressure.

Step of Providing Water Repellent Treatment

After the plasma treatment is provided, water repellent treatment (liquid repellent treatment) is provided (step S103). Therefore, in particular, wetting characteristics on the top face and the side face of the upper dividing wall 15B are lowered. Specifically, plasma treatment ($CF_4$ plasma treatment) with the use of methane tetrafluoride as reaction gas is provided under atmospheric pressure. Thereafter, the substrate 11 heated for the plasma treatment is cooled down to room temperature. Therefore, the top face and the side face of the upper dividing wall 15B are treated to have liquid repellent characteristics, and therefore the wetting characteristics thereof are lowered.

In the $CF_4$ plasma treatment, an exposed face of the lower electrode 14 and the lower dividing wall 15A are somewhat affected. However, ITO as a material of the lower electrode 14 and $SiO_2$ or the like as a component material of the lower dividing wall 15A have a low affinity to fluorine. Thus, in the face with the wetting characteristics improved by the oxygen plasma treatment, the wetting characteristics are retained.

Step of Forming the Hole Injection Layers 16AR, 16AG, and 16AB

Figure 5B:
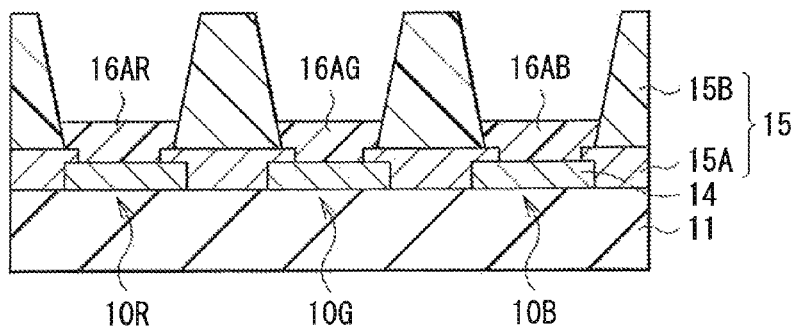

After the water repellent treatment is provided, as illustrated in FIG. 5B, the hole injection layers 16AR, 16AG, and 16AB made of the foregoing material are formed in the region surrounded by the upper dividing wall 15B (step S104). The hole injection layers 16AR, 16AG, and 16AB are formed by coating method such as spin coating method and droplet discharge method. In particular, since the formation material of the hole injection layers 16AR, 16AG, and 16AB should be selectively arranged in the region surrounded by the upper dividing wall 15B, ink jet method or nozzle coating method as a droplet discharge method is preferably used.

Specifically, for example, by ink jet method, a solution or dispersion liquid of polyaniline, polythiophene or the like as the formation material of the hole injection layers 16AR, 16AG, and 16AB is arranged on the exposed face of the lower electrode 14. Thereafter, by providing heat treatment (dry treatment), the hole injection layers 16AR, 16AG, and 16AB are formed.

In the heat treatment, a solvent or a dispersion medium is dried and heated at high temperature. In the case where a conductive polymer such as polyaniline and polythiophene is used, air atmosphere or oxygen atmosphere is preferable, since the conductive polymer is oxidized by oxygen and therefore conductivity is easily expressed.

Heating temperature is preferably from 150 degrees centigrade to 300 degrees centigrade both inclusive, and more preferably from 180 degrees centigrade to 250 degrees centigrade both inclusive. Heating time is preferably about from 5 minutes to 300 minutes, and more preferably from 10 minutes to 240 minutes both inclusive though time depends on temperature and atmosphere. The film thickness after drying is preferably from 5 nm to 100 nm both inclusive, and more preferably from 8 nm to 50 nm both inclusive.

Step of Forming the Hole Transport Layers 16BR and 16BG of the Red Organic EL Device 10R and the Green Organic EL Device 10G

Figure 5C:
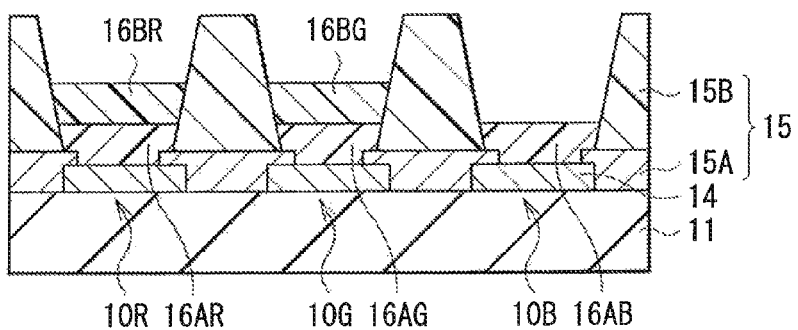

After the hole injection layers 16AR, 16AG, and 16AB are formed, as illustrated in FIG. 5C, the hole transport layers 16BR and 16BG made of the foregoing polymer material are formed on the hole injection layers 16AR and 16AG respectively for the red organic EL device 10R and the green organic EL device 10G (step S105). The hole transport layers 16BR and 16BG are formed by coating method such as spin coating method and droplet discharge method. In particular, since the formation material of the hole transport layers 16BR and 16BG should be selectively arranged in the region surrounded by the upper dividing wall 15B, ink jet method or nozzle coating method as a droplet discharge method is preferably used.

Specifically, for example, by ink jet method, a solution or dispersion liquid of a polymer as the formation material of the hole transport layers 16BR and 16BG is arranged on the exposed face of the hole injection layers 16AR and 16AG. Thereafter, by providing heat treatment (dry treatment), the hole transport layers 16BR and 16BG of the red organic EL device 10R and the green organic EL device 10G are formed.

In the heat treatment, a solvent or a dispersion medium is dried and heated at high temperature. As atmosphere in which coating is performed and the solvent is dried and heated, atmosphere having a main component of nitrogen (N2) is preferable. If oxygen and moisture exists, there is a possibility that light emitting efficiency and life of the formed organic EL display unit are lowered. In particular, in the heating step, influence of oxygen and moisture is large, to which attention should be paid. The oxygen concentration is preferably from 0.1 ppm to 100 ppm both inclusive, and more preferably 50 ppm or less. In the case where oxygen with a concentration larger than 100 ppm exists, the interface of the formed thin film is contaminated, and therefore there is a possibility that light emitting efficiency and life of the obtained organic EL display unit are lowered. Further, in the case where oxygen with a concentration smaller than 0.1 ppm exists, though device characteristics are not damaged, cost of equipment for keeping the concentration of atmosphere smaller than 0.1 ppm may be extremely large in the current mass production process. Further, regarding moisture, for example, the dew point is preferably from −80 degrees centigrade to −40 degrees centigrade both inclusive, more preferably −50 degrees centigrade or less, and much more preferably −60 degrees centigrade or less. In the case where moisture having a dew point higher than −40 degrees centigrade exists, there is a possibility that the interface of the formed thin film is contaminated, and light emitting efficiency and life of the obtained organic EL display unit are lowered. Further, in the case where moisture having a dew point lower than −80 degrees centigrade exists, though device characteristics are not damaged, cost of equipment for keeping the dew point lower than −80 degrees centigrade may be extremely large in the current mass production process.

Heating temperature is preferably from 100 degrees centigrade to 230 degrees centigrade both inclusive, and more preferably from 100 degrees centigrade to 200 degrees centigrade both inclusive. Heating temperature is preferably at least lower than the temperature at which the hole injection layers 16AR, 16AG, and 16AB are formed. Time is preferably about from 5 minutes to 300 minutes both inclusive, and more preferably from 10 minutes to 240 minutes both inclusive though time depends on temperature and atmosphere. The film thickness after drying is preferably from 10 nm to 200 nm both inclusive, and more preferably from 15 nm to 150 nm both inclusive though the film thickness depends on the whole structure of the device.

Figure 6A:
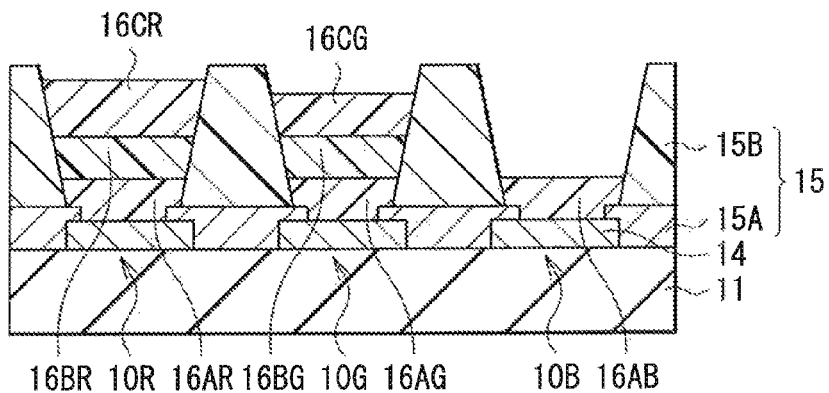
FIGS. 6A to 6C are cross sectional views illustrating steps following FIGS. 5A to 5C.

Step of Forming the Red Light Emitting Layer 16CR and the Green Light Emitting Layer 16CG After the hole transport layers 16BR and 16BG of the red organic EL device 10R and the green organic EL device 10G are formed, as illustrated in FIG. 6A, the red light emitting layer 16CR made of the foregoing polymer material is formed on the hole transport layer 16BR of the red organic EL device. Further, the green light emitting layer 16CG made of the foregoing polymer material is formed on the hole transport layer 16BG of the green organic EL device (step S106). The red light emitting layer 16CR and the green light emitting layer 16CG are formed by coating method such as spin coating method and droplet discharge method. In particular, since the formation material of the red light emitting layer 16CR and the green light emitting layer 16CG should be selectively arranged in the region surrounded by the upper dividing wall 15B, ink jet method or nozzle coating method as a droplet discharge method is preferably used.

Specifically, for example, by ink jet method, a solution or dispersion liquid of a polymer as the formation material of the red light emitting layer 16CR and the green light emitting layer 16CG is arranged on the exposed face of the hole transport layers 16BR and 16BG. Thereafter, by providing heat treatment (dry treatment), the red light emitting layer 16CR and the green light emitting layer 16CG are formed.

In the heat treatment, a solvent or a dispersion medium is dried and heated at high temperature. As atmosphere in which coating is performed and the solvent is dried and heated, atmosphere having a main component of nitrogen (N2) is preferable. If oxygen and moisture exists, there is a possibility that light emitting efficiency and life of the formed organic EL display unit are lowered. In particular, in the heating step, influence of oxygen and moisture is large, to which attention should be paid. The oxygen concentration is preferably from 0.1 ppm to 100 ppm both inclusive, and more preferably 50 ppm or less. In the case where oxygen with a concentration larger than 100 ppm exists, there is a possibility that the interface of the formed thin film is contaminated, and therefore light emitting efficiency and life of the obtained organic EL display unit are lowered. Further, in the case where oxygen with a concentration smaller than 0.1 ppm exists, though device characteristics are not damaged, cost of equipment for keeping the concentration of atmosphere smaller than 0.1 ppm may be extremely large in the current mass production process. Further, regarding moisture, for example, the dew point is preferably from −80 degrees centigrade to −40 degrees centigrade both inclusive, more preferably −50 degrees centigrade or less, and much more preferably −60 degrees centigrade or less. In the case where moisture having a dew point larger than −40 degrees centigrade exists, the interface of the formed thin film is contaminated, and therefore there is a possibility that light emitting efficiency and life of the obtained organic EL display unit are lowered. Further, in the case where moisture having a dew point lower than −80 degrees centigrade exists, though device characteristics are not damaged, cost of equipment for keeping the dew point lower than −80 degrees centigrade may be extremely large in the current mass production process.

Heating temperature is preferably from 100 degrees centigrade to 230 degrees centigrade both inclusive, and more preferably from 100 degrees centigrade to 200 degrees centigrade both inclusive. Heating temperature is preferably at least lower than the temperature at which the hole injection layers 16AR, 16AG, and 16AB are formed. Time is preferably about from 5 minutes to 300 minutes both inclusive, and more preferably from 10 minutes to 240 minutes both inclusive though time depends on temperature and atmosphere. The film thickness after drying is preferably from 10 nm to 200 nm both inclusive, and more preferably from 15 nm to 150 nm both inclusive though the film thickness depends on the whole structure of the device.

Step of Forming the Hole Transport Layer 16BB of the Blue Organic EL Device 10B

Figure 6B:
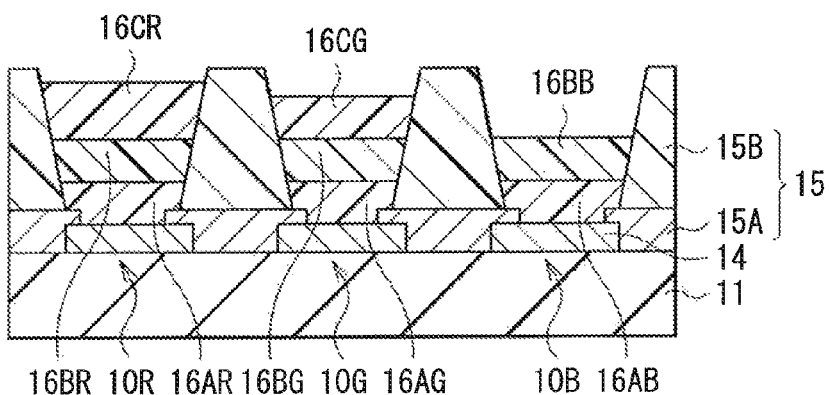

After the red light emitting layer 16CR and the green light emitting layer 16CG are formed, as illustrated in FIG. 6B, the hole transport layer 16BB made of the foregoing low molecular material is formed on the hole injection layer 16AB for the blue organic light emitting device 10B (step S107). The hole transport layer 16BB is formed by coating method such as spin coating method and droplet discharge method. In particular, since the formation material of the hole transport layer 16BB should be selectively arranged in the region surrounded by the upper dividing wall 15B, ink jet method or nozzle coating method as a droplet discharge method is preferably used.

Specifically, for example, by ink jet method, a low molecular solution or low molecular dispersion liquid as the formation material of the hole transport layer 16BB is arranged on the exposed face of the hole injection layer 16AB. Thereafter, by providing heat treatment (dry treatment), the hole transport layer 16BB is formed.

In the heat treatment, a solvent or a dispersion medium is dried and heated at high temperature. As atmosphere in which coating is performed and the solvent is dried and heated, atmosphere having a main component of nitrogen (N2) is preferable. If oxygen and moisture exists, there is a possibility that light emitting efficiency and life of the formed organic EL display unit are lowered. In particular, in the heating step, influence of oxygen and moisture is large, to which attention should be paid. The oxygen concentration is preferably from 0.1 ppm to 100 ppm both inclusive, and more preferably 50 ppm or less. In the case where oxygen with a concentration larger than 100 ppm exists, there is a possibility that the interface of the formed thin film is contaminated, and therefore light emitting efficiency and life of the obtained organic EL display unit are lowered. Further, in the case where oxygen with a concentration smaller than 0.1 ppm exists, though device characteristics are not damaged, cost of equipment for keeping the concentration of atmosphere smaller than 0.1 ppm may be extremely large in the current mass production process. Further, regarding moisture, for example, the dew point is preferably from −80 degrees centigrade to −40 degrees centigrade both inclusive, more preferably −50 degrees centigrade or less, and much more preferably −60 degrees centigrade or less. In the case where moisture having a dew point higher than −40 degrees centigrade exists, the interface of the formed thin film is contaminated, and therefore there is a possibility that light emitting efficiency and life of the obtained organic EL display unit are lowered. Further, in the case where moisture having a dew point lower than −80 degrees centigrade exists, though device characteristics are not damaged, cost of equipment for keeping the dew point lower than −80 degrees centigrade may be extremely large in the current mass production process.

Heating temperature is preferably from 100 degrees centigrade to 230 degrees centigrade both inclusive, and more preferably from 100 degrees centigrade to 200 degrees centigrade both inclusive though heating temperature depends on characteristics of the material. Heating temperature is preferably at least lower than the temperature at which the hole injection layers 16AR, 16AG, and 16AB are formed. Further, if heating is continued at temperature excessively exceeding Tg of the low molecular material, characteristics may be largely lowered. Heating time is preferably about from 5 minutes to 300 minutes both inclusive, and more preferably from 10 minutes to 240 minutes both inclusive though time depends on temperature and atmosphere. The film thickness after drying is preferably from 10 nm to 200 nm both inclusive, and more preferably from 15 nm to 150 nm both inclusive though the film thickness depends on the whole structure of the device.

Order of Steps

The step of forming the hole transport layers 16BR and 16BG of the red organic EL device 10R and the green organic EL device 10G, the step of forming the hole transport layer 16BB of the blue organic EL device 10B, and the step of forming the red light emitting layer 16CR and the green light emitting layer 16CG may be performed in any order. However, it is necessary that at least a base on which a layer to be formed is developed is previously formed, and the heating step of the respective heating and drying steps is performed between each step. Further, it is necessary that coating is provided so that temperature in the heating step is equal to or lower than temperature in the previous step. For example, in the case where heating temperature of the red light emitting layer 16CR and the green light emitting layer 16CG is 130 degrees centigrade and heating temperature of the hole transport layer 16BB for the blue organic EL device 10B is 130 degrees centigrade as well, it may be possible that coating of the red light emitting layer 16CR and the green light emitting layer 16CG is performed without drying and continuously coating of the hole transport layer 16BB for the blue organic EL device 10B is performed, and subsequently the drying and heating step of the red light emitting layer 16CR, the green light emitting layer 16CG, and the hole transport layer 16BB for the blue organic EL device 10B is performed. Further, in the foregoing respective steps, drying and heating are preferably performed as a separate step for the following reason. In the drying step, a coated wet film is significantly easily flown, and thus film unevenness is easily generated. A preferable drying step is a method of uniformly drying under vacuum and at normal pressures. Further, drying without wind blow is desirable. In the heating step, the solvent is evaporated to some extent and the fluidity is lowered, the film is hardened. By slowly applying heat to the hardened film, a slight amount of remaining solvent is able to be removed, and the light emitting material and the material of the hole transport layer are able to be provided with rearrangement at molecular level.

Step of Forming the Blue Light Emitting Layer 16CB

Figure 6C:
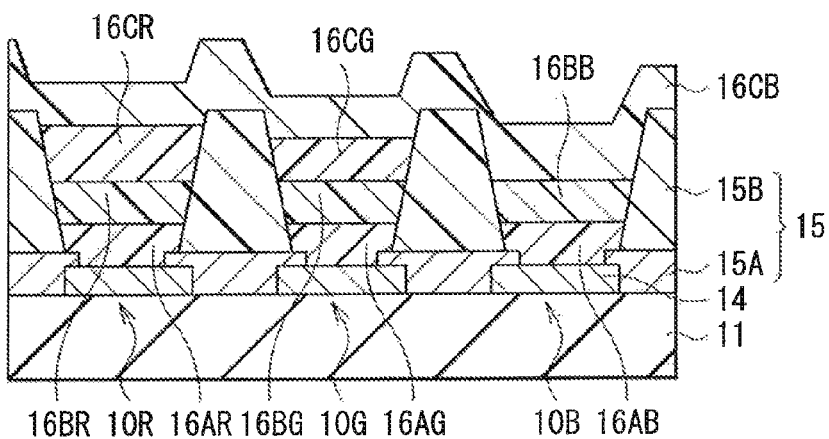

After the hole transport layer 16BB for the blue organic EL device 10B, the red light emitting layer 16CR, and the green light emitting layer 16CG are formed, as illustrated in FIG. 6C, the blue light emitting layer 16CB made of the foregoing low molecular material is formed as a common layer on the whole area of the red light emitting layer 16CR, the green light emitting layer 16CG, and the hole transport layer 16BB for the blue organic EL device 10B (step S108).

Step of Forming the Electron Transport Layer 16D, the Electron Injection Layer 16E, and the Upper Electrode 17

Figure 7A:
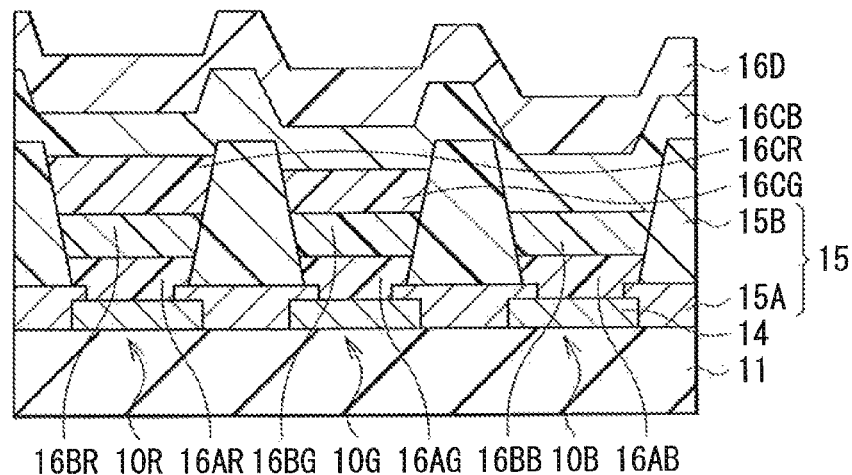
FIGS. 7A to 7C are cross sectional views illustrating steps following FIGS. 6A to 6C.
Figure 7B:
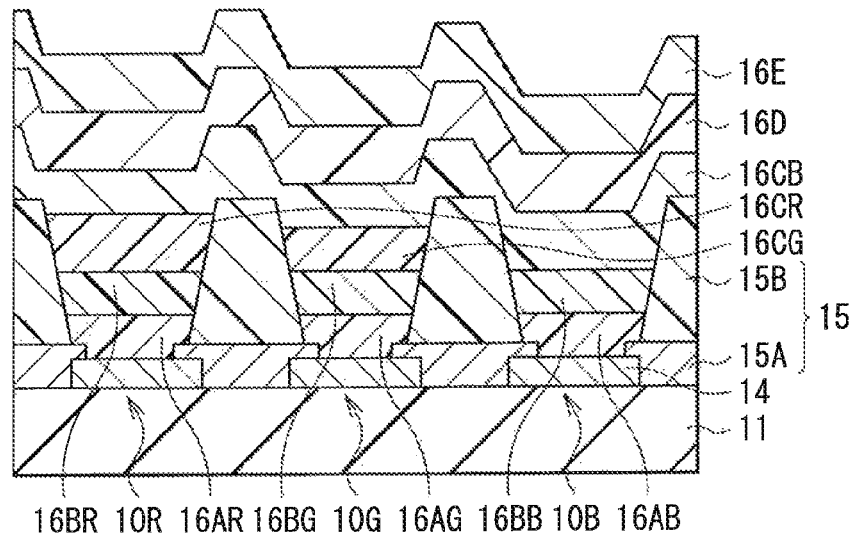
Figure 7C:
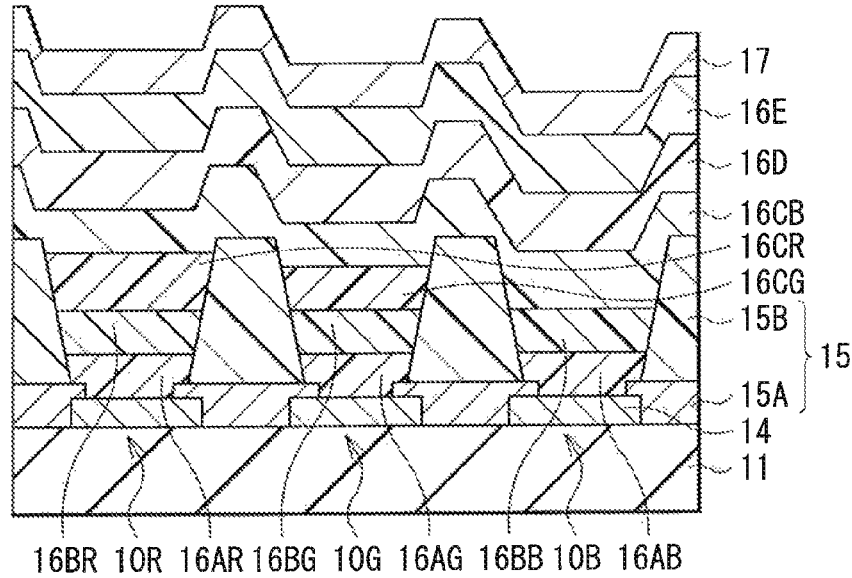

After the blue light emitting layer 16CB is formed, as illustrated in FIG. 7A, FIG. 7B, and FIG. 7C, the electron transport layer 16D, the electron injection layer 16E, and the upper electrode 17 made of the foregoing material are formed on the whole area of the blue light emitting layer 16CB by evaporation method (steps S109, S110, and S111).

After the upper electrode 17 is formed, as illustrated in FIG. 3, the protective layer 20 is formed by film forming method such as evaporation method and CVD method in which film formation particle energy is small to the degree at which little effect exists on the base. For example, in the case where the protective layer 20 composed of amorphous silicon nitride is formed, a film having a film thickness from 2 to 3 µm both inclusive is formed by CVD method. At this time, film forming temperature is desirably set to normal temperature to prevent luminance lowering due to deterioration of the organic layer 16, and film forming is desirably performed under conditions that the film stress is the minimum to prevent exfoliation of the protective layer 20.

The blue light emitting layer 16CB, the electron transport layer 16D, the electron injection layer 16E, the upper electrode 17, and the protective layer 20 are fully formed in a state of a solid film without using a mask. Further, forming of the blue light emitting layer 16CB, the electron transport layer 16D, the electron injection layer 16E, the upper electrode 17, and the protective layer 20 is desirably performed continuously in the same film forming equipment without being exposed in the air. Therefore, deterioration of the organic layer 16 due to moisture in the air is prevented.

In the case where an auxiliary electrode (not illustrated) is formed in the same step as that of the lower electrode 14, the organic layer 16 formed in a state of a solid film on the auxiliary electrode may be removed by a method such as laser ablation before forming the upper electrode 17. Therefore, the upper electrode 17 is able to be directly connected to the auxiliary electrode, and contact is improved.

After the protective film 20 is formed, for example, the light shielding film made of the foregoing material is formed on the sealing substrate 40 made of the foregoing material. Subsequently, the sealing substrate 40 is coated with a material of the red filter (not illustrated) by spin coating method or the like. The resultant is patterned by photolithography technology, burned, and therefore the red filter is formed. Subsequently, the blue filter (not illustrated) and the green filter (not illustrated) are sequentially formed in the same manner as in the red filter (not illustrated).

Thereafter, the adhesive layer (not illustrated) is formed on the protective layer 20, and the sealing substrate 40 and the protective layer 20 are bonded with the adhesive layer in between. Accordingly, the display unit illustrated in FIG. 1 to FIG. 3 is completed.

In the display unit, the scanning signal is supplied to each pixel through the gate electrode of the writing transistor Tr2 from the scanning line drive circuit 130, and the image signal from the signal line drive circuit 120 is retained in the retentive capacity Cs through the writing transistor Tr2. In other words, the drive transistor Tr1 is on/off controlled according to the signal retained in the retentive capacity Cs, and therefore drive current Id is injected into the red organic EL device 10R, the green organic EL device 10G, and the blue organic EL device 10B, electron-hole recombination is generated, and therefore light is emitted. The light is transmitted through the lower electrode 14 and the substrate 11 in the case of bottom emission, and is transmitted through the upper electrode 17, the color filter (not illustrated), and the sealing substrate 40 in the case of top emission, and is extracted.

At this time, in the red organic EL device 10R, the red light emitting layer 16CR and the blue light emitting layer 16CB are provided, energy transfer is generated in red having the lowest energy level, and red light emission is dominant. In the green organic EL device 10G, the green light emitting layer 16CG and the blue light emitting layer 16CB are provided, energy transfer is generated in green having lower energy level, and green light emission is dominant. In the blue organic EL device 10B, since only the blue light emitting layer 16CB is provided, blue light emission is generated. In this case, the hole transport layer 16BB for the blue organic EL device 10B is made of the low molecular material. Thus, state of the interface with the blue light emitting layer 16CB made of the low molecular material is improved, and light emitting efficiency and life of blue are improved.

As described above, in this embodiment, the hole transport layer 16BB made of the low molecular material is formed on the hole injection layer 16AB of the blue organic EL device 10B by coating method. Thus, state of the interface with the blue light emitting layer 16CB made of the low molecular material is able to be improved, and light emitting efficiency and life of blue are able to be improved. Thus, in the color organic EL display unit in which the red organic EL device 10R, the green organic EL device 10G, and the blue organic EL device 10B are arranged, light emitting efficiency and life are further improved. In addition, difficulty of patterning in evaporation is able to be resolved, and low cost is able to be realized by printing process.

Module and Application Examples

A description will be given of application examples of the organic EL display unit described in the foregoing embodiment. The organic EL display unit of the foregoing embodiment is able to be applied to a display unit of an electronic device in any field for displaying a video signal inputted from outside or a video signal generated inside as an image or a video, such as a television device, a digital camera, a notebook personal computer, a portable terminal device such as a mobile phone, and a video camera.

Module

Figure 8:
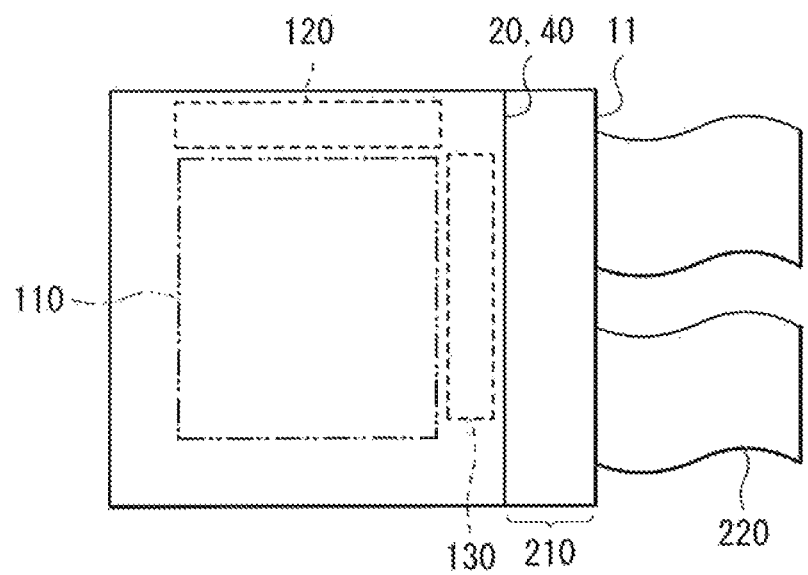
FIG. 8 is a plan view illustrating a schematic structure of a module including the display unit of the foregoing embodiment.

The organic EL display unit of the foregoing embodiment is incorporated in various electronic devices such as aftermentioned first to fifth application examples as a module as illustrated in FIG. 8, for example. In the module, for example, a region 210 exposed from the protective layer 20 and the sealing substrate 40 is provided on one side of the substrate 11, and an external connection terminal (not illustrated) is formed in the exposed region 210 by extending the wirings of the signal line drive circuit 120 and the scanning line drive circuit 130. The external connection terminal may be provided with a Flexible Printed Circuit (FPC) 220 for inputting and outputting a signal.

First Application Example

Figure 9:
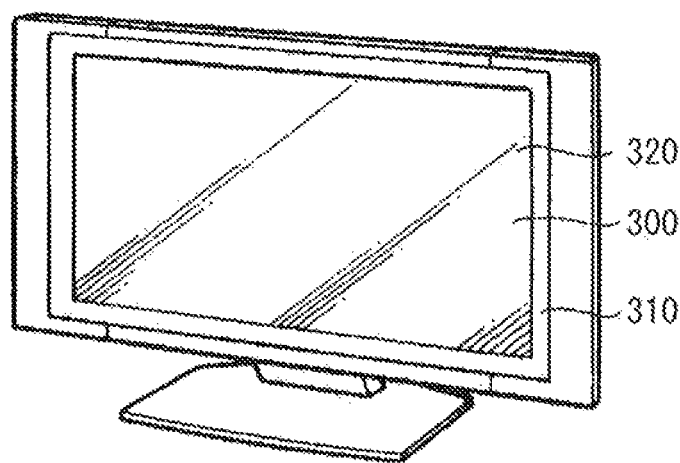
FIG. 9 is a perspective view illustrating an appearance of a first application example of the display unit of the foregoing embodiment.

FIG. 9 is an appearance of a television device to which the organic EL display unit of the foregoing embodiment is applied. The television device has, for example, a video display screen section 300 including a front panel 310 and a filter glass 320. The video display screen section 300 is composed of the organic EL display unit according to the foregoing embodiment.

Second Application Example

Figure 10A:
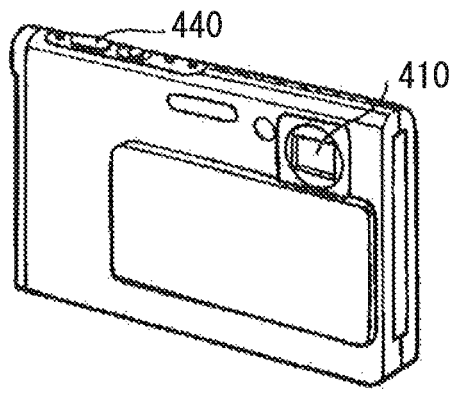
FIG. 10A is a perspective view illustrating an appearance viewed from the front side of a second application example.
Figure 10B:
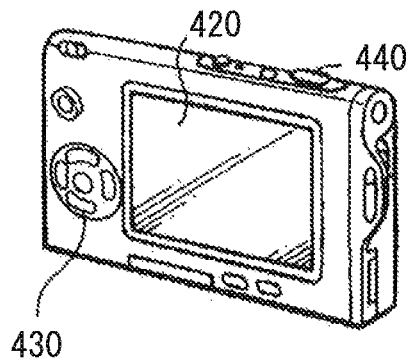
FIG. 10B is a perspective view illustrating an appearance viewed from the rear side of the second application example.

FIGS. 10A and 10B are an appearance of a digital camera to which the organic EL display unit of the foregoing embodiment is applied. The digital camera has, for example, a light emitting section for a flash 410, a display section 420, a menu switch 430, and a shutter button 440. The display section 420 is composed of the organic EL display unit according to the foregoing embodiment.

Third Application Example

Figure 11:
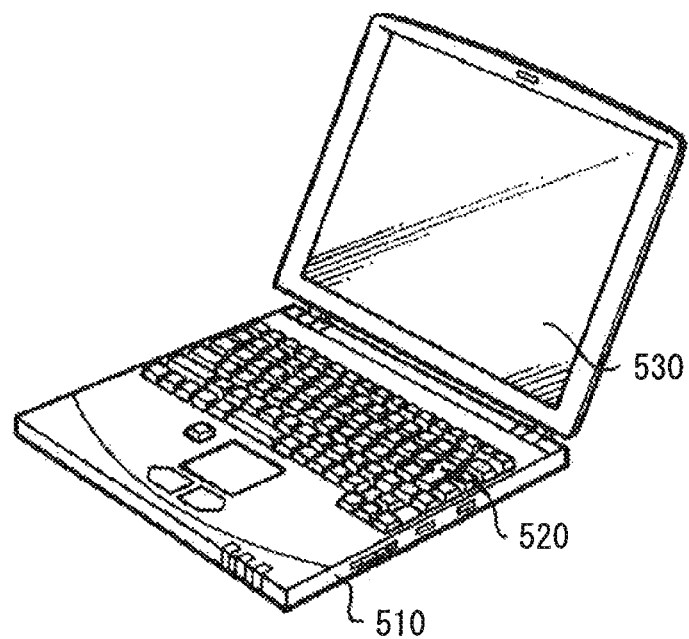
FIG. 11 is a perspective view illustrating an appearance of a third application example.

FIG. 11 is an appearance of a notebook personal computer to which the organic EL display unit of the foregoing embodiment is applied. The notebook personal computer has, for example, a main body 510, a keyboard 520 for operation of inputting characters and the like, and a display section 530 for displaying an image. The display section 530 is composed of the organic EL display unit according to the foregoing embodiment.

Fourth Application Example

Figure 12:
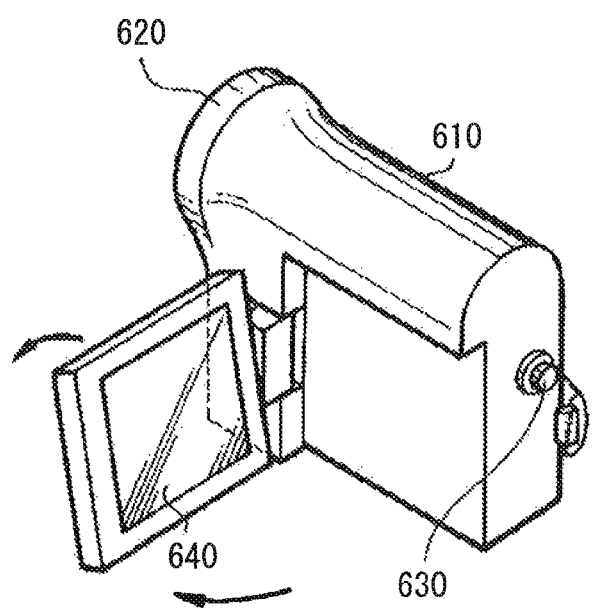
FIG. 12 is a perspective view illustrating an appearance of a fourth application example.
Figure 13:
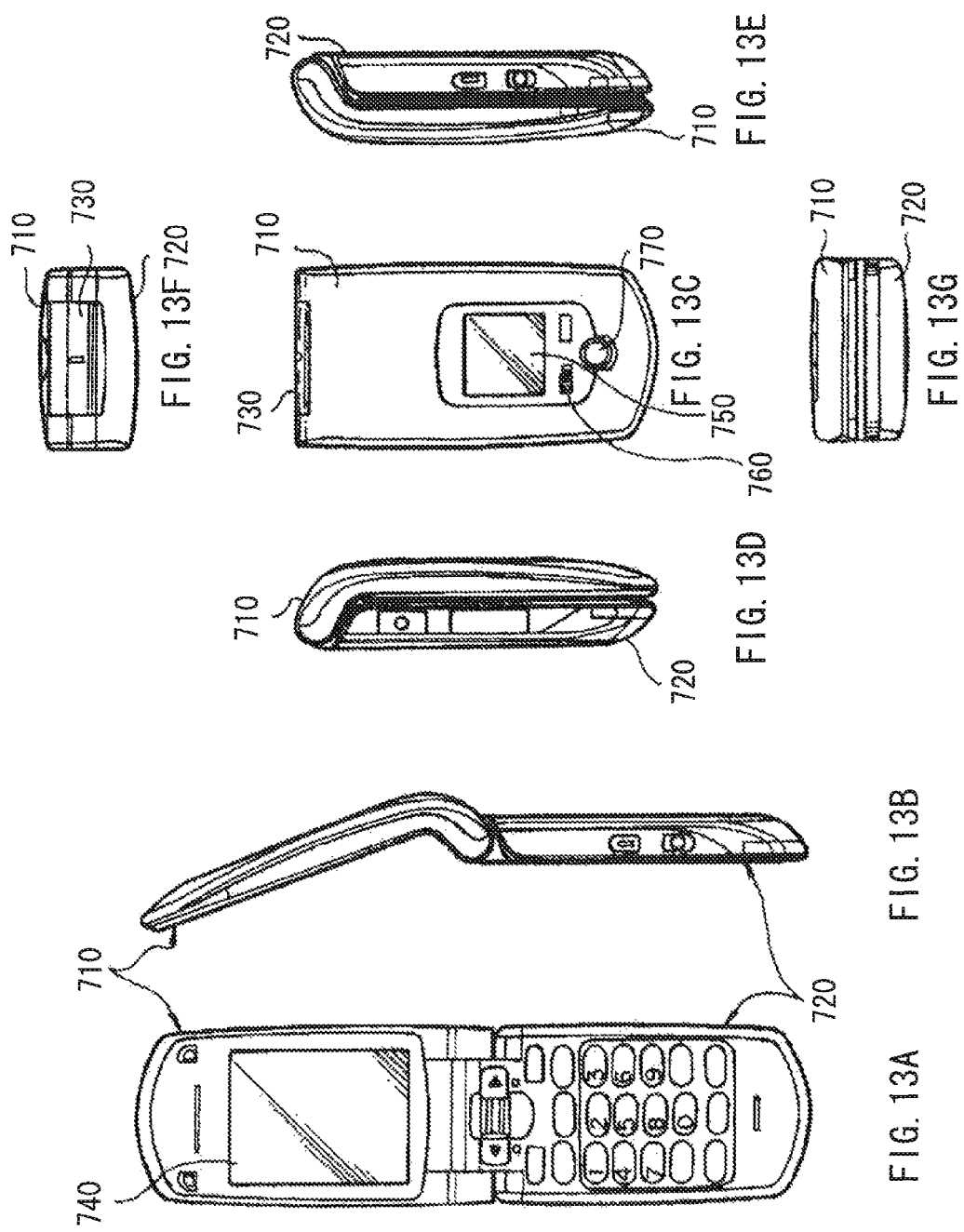
FIG. 13A is an elevation view of a fifth application example unclosed.
FIG. 13B is a side view thereof.
FIG. 13C is an elevation view of the fifth application example closed.
FIG. 13D is a left side view thereof.
FIG. 13E is a right side view thereof.
FIG. 13F is a top view thereof.
FIG. 13G is a bottom view thereof.

FIG. 12 is an appearance of a video camera to which the organic EL display unit of the foregoing embodiment is applied. The video camera has, for example, a main body 610, a lens 620 for shooting an object provided on the front side face of the main body 610, a start/stop switch in shooting 630, and a display section 640. The display section 640 is composed of the organic EL display unit according to the foregoing embodiment.

Fifth Application Example

FIGS. 13A to 13G are an appearance of a mobile phone to which the organic EL display unit of the foregoing embodiment is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the organic EL display unit according to the foregoing embodiment.

EXAMPLES

A description will be given of specific examples of the application.

Example 1

The substrate 11 having dimensions of 25 mm×25 mm was formed respectively for the red organic EL device 10R, the green organic EL device 10G, and the blue organic EL device 10B.

First, as the substrate 11, a glass substrate (25 mm×25 mm) was prepared. On the substrate 11, as the lower electrode 14, a two-layer structure composed of a silver alloy layer made of an Ag—Pd—Cu alloy having a thickness of 120 nm and a transparent conductive film made of ITO having a thickness of 10 nm was formed (step 101).

Subsequently, as the hole injection layers 16AR, 16AG, and 16AB, ND1501 (polyaniline, made by Nissan Chemical Industries Ltd.) was coated to obtain a thickness of 15 nm by spin coating method in the air, and the resultant was thermally hardened on a hot plate for 30 minutes at 220 degrees centigrade (step S104).

Thereafter, the hole injection layers 16AR and 16AG were coated with a polymer expressed by Structural formula 3(1) shown in Chemical formula 10 as the hole transport layers 16BR and 16BG by spin coating method in N2 (dew point: −60 degrees centigrade, oxygen concentration: 10 ppm). The thickness of the hole transport layer 16BR for the red organic EL device 10R was 100 nm, and the thickness of the hole transport layer 16BG of the green organic EL device 10G was 90 nm. Thereafter, the resultant was thermally hardened on a hot plate for 60 minutes at 180 degrees centigrade in N2 (dew point: −60 degrees centigrade, oxygen concentration: 10 ppm) (step S105).

Chemical formula 10

Structural formula 3(1)

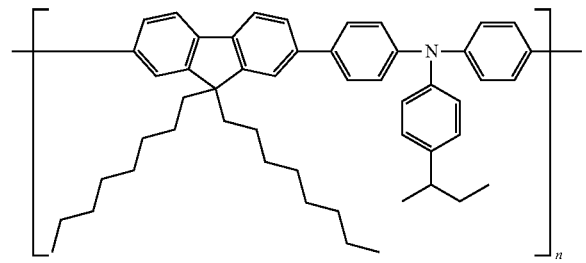

After the hole transport layers 16BR and 16BG were formed, the hole transport layer 16BR of the red organic EL device 10R was coated with a fluorenone polyarylene material having benzothiadiazole as a block as the red light emitting layer 16CR by spin coating method to have a thickness of 80 nm. Further, the hole transport layer 16BG of the green organic EL device 10G was coated with a fluorenone polyarylene material having anthracene as a block as the green light emitting layer 16CG by spin coating method to have a thickness of 60 nm. Subsequently, the resultant was thermally hardened on a hot plate for 10 minutes at 130 degrees centigrade in N2 (dew point: −60 degrees centigrade, oxygen concentration: 10 ppm) (step S106).

After the red light emitting layer 16CR and the green light emitting layer 16CG were formed, the hole injection layer 16AB for the blue organic EL device 10B was coated with a low molecular material expressed by Structural formula 1(56) shown in Chemical formula 11 as the hole transport layer 16BB by spin coating method to obtain a thickness of 50 nm. Thereafter, the resultant was heated on a hot plate for 60 minutes at 100 degrees centigrade in N2 (dew point: −60 degrees centigrade, oxygen concentration: 10 ppm) (step S107).

Chemical formula 11

Compound 1(56)

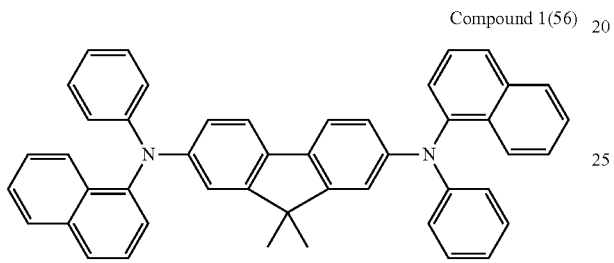

After the hole transport layer 16BB was formed, the substrate 11 for the red organic EL device 10R in which layers up to the red light emitting layer 16CR were formed, the substrate 11 for the green organic EL device 10G in which layers up to the green light emitting layer 16CG were formed, and the substrate 11 for the blue organic EL device 10B in which layers up to the hole transport layer 16BB were formed were moved into a vacuum evaporator, and layers on and after the blue light emitting layer 16CB were evaporated.

First, as the blue light emitting layer 16CB, ADN (9,10-di(2-naphthyl)anthracene) (Structural formula 2(20)) shown in Chemical formula 12 and a blue dopant (Structural formula 103) shown in Chemical formula 13 were co-evaporated at a ratio of 95:5 (step S108).

Chemical formula 12

Compound 2(20)

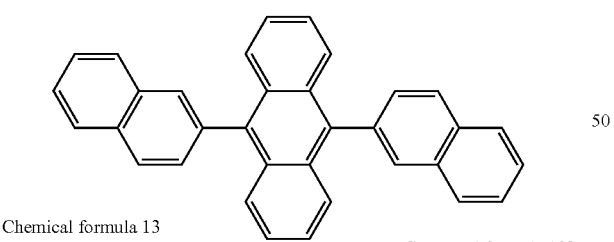

Chemical formula 13

Structural formula 103

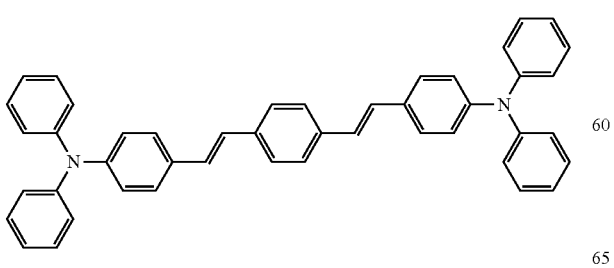

After the blue light emitting layer 16CB was formed, Alq3 (8-hydroxyquinoline aluminum) (Structural formula 104) shown in Chemical formula 14 as the electron transport layer 16D was evaporated by vacuum evaporation method (step S109). Subsequently, by evaporation method again, LiF as the electron injection layer 16E was formed to obtain a thickness of 0.3 nm (step S110), and Mg—Ag as the upper electrode 17 was formed to obtain a thickness of 10 nm (step S111). Finally, the protective layer 20 composed of SiN was formed by CVD method, and solid sealing was provided by using a transparent resin. The red organic EL device 10R, the green organic EL device 10G, and the blue organic EL device 10B obtained as above were combined, and therefore a full color organic EL display unit was obtained.

Chemical formula 14

Structural formula 104

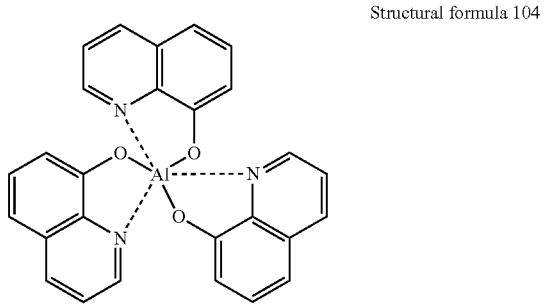

Comparative Example 1

An organic EL display unit was fabricated in the same manner as that of Example 1, except that the polymer material (Structural formula 3(1)) shown in Chemical formula 10 was used in the step of forming the hole transport layer of the blue organic EL device in the procedure of fabricating the organic EL display unit described in Example 1.

Comparative Example 2

An organic EL display unit was fabricated in the same manner as that of Example 1, except that a polymer material (Structural formula 3(2)) shown in Chemical formula 15 was used in the step of forming the hole transport layer of the red organic EL device and the green organic EL device and the hole transport layer of the blue organic EL device described in Example 1.

Chemical formula 15

Structural formula 3(2)

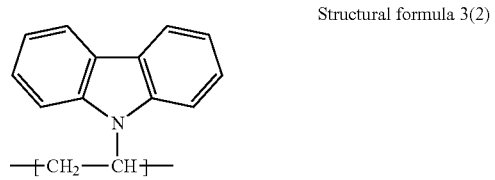

Example 2

An organic EL display unit was fabricated in the same manner as that of Example 1, except that Structural formula 1(58) shown in Chemical formula 16 was used in the step of forming the hole transport layer 16BB of the blue organic EL device 10B described in Example 1.

Chemical formula 16

Compound 1(58)

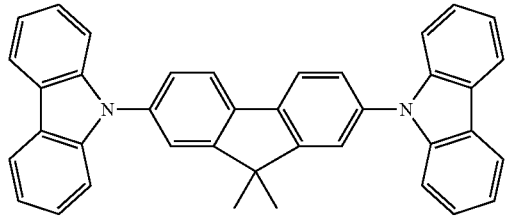

Example 3

An organic EL display unit was fabricated in the same manner as that of Example 1, except that Structural formula 1(22) shown in Chemical formula 17 was used in the step of forming the hole transport layer 16BB of the blue organic EL device 10B described in Example 1.

Chemical formula 17

Compound 1(22)

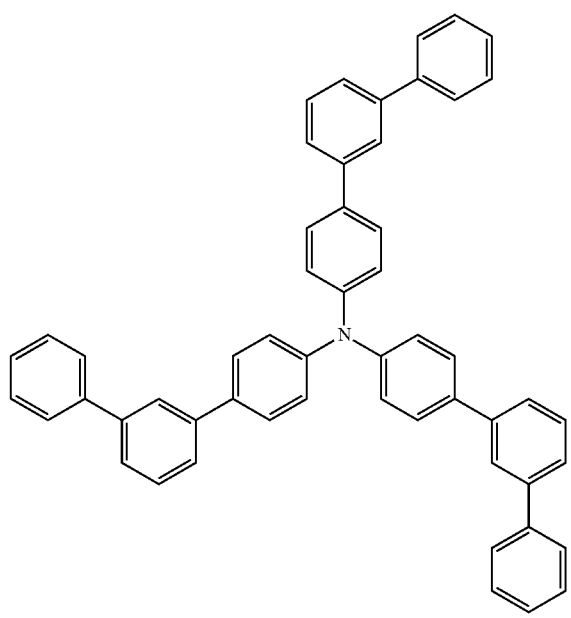

Example 4

An organic EL display unit was fabricated in the same manner as that of Example 1, except that Structural formula 1(23) shown in Chemical formula 18 was used in the step of forming the hole transport layer 16BB of the blue organic EL device 10B described in Example 1.

Chemical formula 18

Compound 1(23)

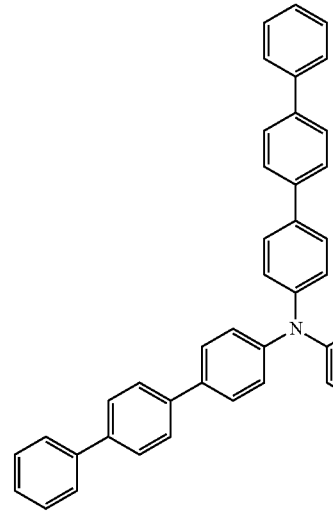

Examples 5 to 9

Influence of Heating Temperature

An organic EL display unit was fabricated in the same manner as that of Example 1, except that the heating temperature after forming the hole transport layer 16BB of the blue organic EL device 10B described in Example 1 was changed to 50 degrees centigrade in Example 5, 80 degrees centigrade in Example 6, 130 degrees centigrade in Example 7, 150 degrees centigrade in Example 8, and 180 degrees centigrade in Example 9.

Examples 10 to 14

Influence of Dew Point in Heating

An organic EL display unit was fabricated in the same manner as that of Example 1, except that the dew point in the heating step after forming the hole transport layer 16BB of the blue organic EL device 10B described in Example 1 was changed to −80 degrees centigrade in Example 10, −70 degrees centigrade in Example 11, −50 degrees centigrade in Example 12, −40 degrees centigrade in Example 13, and −10 degrees centigrade in Example 14.

Examples 15 to 18

Influence of Oxygen Concentration in Heating

An organic EL display unit was fabricated in the same manner as that of Example 1, except that the oxygen concentration in the heating step after forming the hole transport layer 16BB of the blue organic EL device 10B described in Example 1 was changed to 1000 ppm in Example 15, 100 ppm in Example 16, 1 ppm in Example 17, and 0.1 ppm in Example 18.

Evaluation Result

For the obtained red, green, and blue organic EL devices of Examples 1 to 18 and Comparative examples 1 and 2, drive voltage (v), current efficiency (cd/A), and chromatic coordinate in driving at a current density of 10 mA/cm² were measured. Further, time of luminance reduction by half in the case of constant current driving at a current density of 100 mA/cm² was measured. The results are illustrated in Table 1 to Table 5.

compound 1(22) was used as a low molecular material of the hole transport layer 16BB of the blue organic EL device 10B, and in Example 4 in which the compound 1(23) was used as a low molecular material of the hole transport layer 16BB of the blue organic EL device 10B, current efficiency and life of blue showed high performance.

Figure 14:
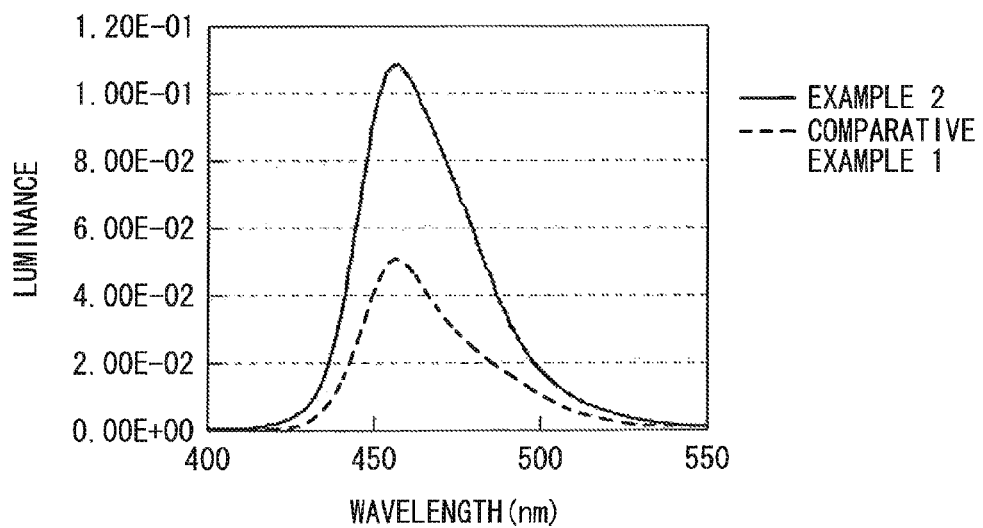
FIG. 14 is a diagram illustrating a result of an example.
Figure 15:
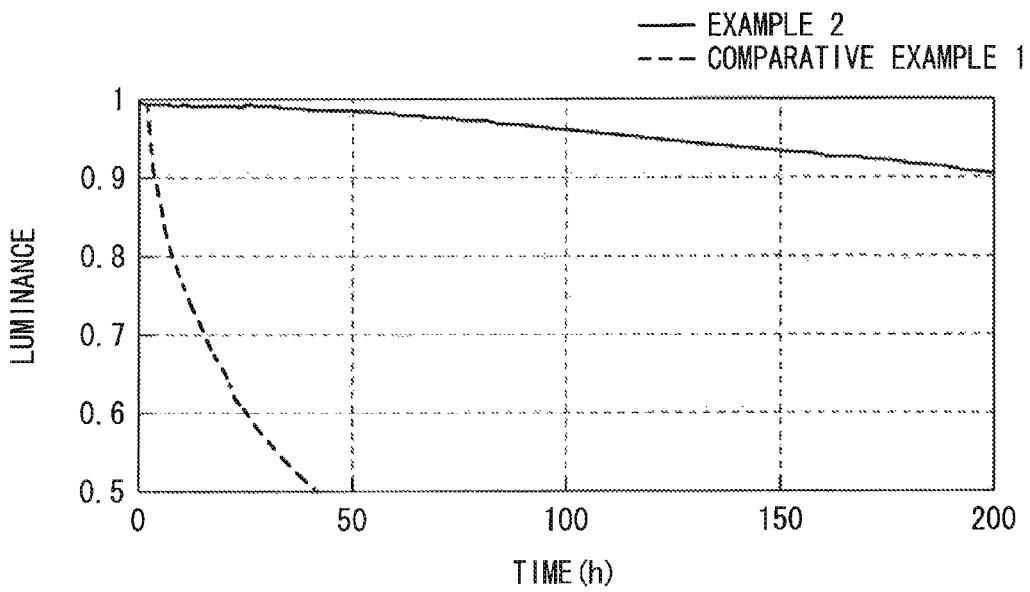
FIG. 15 is a diagram illustrating a result of the example.

FIG. 14 and FIG. 15 respectively illustrate results obtained by examining light emitting spectrum and life for the blue

TABLE 1

| Example | Light emitting color | Hole transport layer | Blue light emitting layer (common layer) | Blue hole transport layer: heating temperature | Blue hole transport layer: heating environmental dew point | Blue hole transport layer: heating environmental oxygen concentration | Drive voltage (V) | Current efficiency (Cd/A) | Chromatic coordinate (x, y) | Acceleration test T90 (h) |
|---|---|---|---|---|---|---|---|---|---|---|
| Example 1 | Red | Compound 3(1) | 2(20)/103 | | | | 8.7 | 7.5 | 0.65, 0.32 | 340 h |
| | Green | Compound 3(1) | | | | | 7.8 | 7.8 | 0.20, 0.68 | 280 h |
| | Blue | Compound 1(56) | | | | | 5.3 | 7.3 | 0.15, 0.15 | 240 h |
| Comparative example 1 | Red | Compound 3(1) | 2(20)/103 | | | | 8.7 | 7.5 | 0.65, 0.32 | 340 h |
| | Green | Compound 3(1) | | | | | 7.8 | 7.8 | 0.20, 0.68 | 280 h |
| | Blue | Compound 3(1) | | | | | 6.4 | 3.2 | 0.15, 0.15 | 40 h |
| Comparative example 2 | Red | Compound 3(2) | 2(20)/103 | | | | 8.9 | 7.0 | 0.65, 0.32 | 300 h |
| | Green | Compound 3(2) | | | | | 8.0 | 7.2 | 0.20, 0.69 | 270 h |
| | Blue | Compound 3(2) | | | | | 7.2 | 4.6 | 0.18, 0.19 | 50 h |

As evidenced by Table 1, in Example 1 in which the hole transport layer 16BB of the blue organic EL device 10B was formed by coating of the low molecular material, both current efficiency and life of blue were more improved than in Comparative examples 1 and 2 in which the polymer material was used. Meanwhile, in Comparative examples 1 and 2, current efficiency and life of blue were significantly inferior to current efficiency and life of the other colors.

organic EL devices of Example 2 and Comparative example 1. As evidenced by FIG. 14 and FIG. 15, in Example 2 in which the hole transport layer 16BB of the blue organic EL device 10B was made of the low molecular material, both the peak intensity of the light emitting spectrum and the life of blue were significantly improved compared to those in Comparative example 1 in which the polymer material was used.

TABLE 2

| Example | Light emitting color | Hole transport layer | Blue light emitting layer (common layer) | Blue hole transport layer: heating temperature | Blue hole transport layer: heating environmental dew point | Blue hole transport layer: heating environmental oxygen concentration | Drive voltage (V) | Current efficiency (Cd/A) | Chromatic coordinate (x, y) | Acceleration test T90 (h) |
|---|---|---|---|---|---|---|---|---|---|---|
| Example 1 | Blue | Compound 1(56) | 2(20)/103 | 100 deg C. | −60 deg C. | 10 ppm | 5.3 | 7.3 | 0.15, 0.15 | 240 h |
| Example 2 | Blue | Compound 1(58) | | | | | 5.3 | 7.2 | 0.15, 0.15 | 230 h |
| Example 3 | Blue | Compound 1(22) | | | | | 5.6 | 7.1 | 0.15, 0.15 | 200 h |
| Example 4 | Blue | Compound 1(23) | | | | | 5.2 | 7.6 | 0.15, 0.15 | 260 h |

As evidenced by Table 2, in Example 1 in which the compound 1(56) was used as a low molecular material of the hole transport layer 16BB of the blue organic EL device 10B, in Example 2 in which the compound 1(58) was used as a low molecular material of the hole transport layer 16BB of the blue organic EL device 10B, in Example 3 in which the In other words, it was found that in the case where the hole transport layer 16BB of the blue organic EL device 10B was formed by coating of the low molecular material, both light emitting efficiency and life of blue were able to be improved.

TABLE 3

| Example | Light emitting color | Hole transport layer | Blue light emitting layer (common layer) | Blue hole transport layer: heating temperature | Blue hole transport layer: heating environmental dew point | Blue hole transport layer: heating environmental oxygen concentration | Drive voltage (V) | Current efficiency (Cd/A) | Chromatic coordinate (x, y) | Acceleration test T90 (h) |
|---|---|---|---|---|---|---|---|---|---|---|
| Example 5 | Blue | Compound 1(56) | 2(20)/103 | 50 deg C. | −60 deg C. | 10 ppm | 5.4 | 6.2 | 0.15, 0.15 | 180 h |
| Example 6 | Blue | | | 80 deg C. | | | 5.3 | 7.3 | 0.15, 0.15 | 220 h |
| Example 1 | Blue | | | 100 deg C. | | | 5.3 | 7.3 | 0.15, 0.15 | 240 h |
| Example 7 | Blue | | | 130 deg C. | | | 5.3 | 7.2 | 0.15, 0.15 | 240 h |
| Example 8 | Blue | | | 150 deg C. | | | 5.8 | 6.5 | 0.15, 0.15 | 150 h |
| Example 9 | Blue | | | 180 deg C. | | | 6.8 | 2.1 | 0.23, 0.20 | 10 h |

Table 3 illustrates results obtained by changing heating temperature in the heating step after coating the hole transport layer 16BB of the blue organic EL device 10B. As evidenced by Table 3, as temperature was increased from 50 degrees centigrade, current efficiency and life were improved. Meanwhile, in Example 9 in which temperature was increased up to 180 degrees centigrade, increase of drive voltage, decrease of current efficiency, and drastic reduction of life were shown. In other words, it was found that in the case where the heating step is performed at temperature from 50 degrees centigrade to 150 degrees centigrade both inclusive, current efficiency and life of blue were able to be improved.

Table 5 illustrates results obtained by changing atmosphere oxygen concentration in the heating step after coating the hole transport layer 16BB of the blue organic EL device 10B. As evidenced by Table 5, as the oxygen concentration was 100 ppm or more, decrease of current efficiency and reduction of life were confirmed. In other words, it was found that in the case where the atmosphere oxygen concentration was from 0.1 ppm to 100 ppm both inclusive, current efficiency and life of blue were able to be improved. Further, it was found that the atmosphere oxygen concentration was more preferably from 0.1 ppm to 10 ppm both inclusive.

TABLE 4

| Example | Light emitting color | Hole transport layer | Blue light emitting layer (common layer) | Blue hole transport layer: heating temperature | Blue hole transport layer: heating environmental dew point | Blue hole transport layer: heating environmental oxygen concentration | Drive voltage (V) | Current efficiency (Cd/A) | Chromatic coordinate (x, y) | Acceleration test T90 (h) |
|---|---|---|---|---|---|---|---|---|---|---|
| Example 10 | Blue | Compound 1(56) | 2(20)/103 | 100 deg C. | −80 deg C. | 10 ppm | 5.3 | 7.3 | 0.15, 0.15 | 240 h |
| Example 11 | Blue | | | | −70 deg C. | | 5.3 | 7.3 | 0.15, 0.15 | 245 h |
| Example 1 | Blue | | | | −60 deg C. | | 5.3 | 7.3 | 0.15, 0.15 | 240 h |
| Example 12 | Blue | | | | −50 deg C. | | 5.3 | 7.1 | 0.15, 0.15 | 220 h |
| Example 13 | Blue | | | | −40 deg C. | | 5.8 | 6.5 | 0.15, 0.15 | 200 h |
| Example 14 | Blue | | | | −10 deg C. | | 7.2 | 5.4 | 0.23, 0.20 | 150 h |

Table 4 illustrates results obtained by changing atmosphere dew point in the heating step after coating the hole transport layer 16BB of the blue organic EL device 10B. As evidenced by Table 4, significant change of efficiency and life was not shown until about −40 degrees centigrade, but slight reduction of current efficiency and life was confirmed at about −10 degrees centigrade. In other words, it was found that in the case where the atmosphere dew point was from −80 degrees centigrade to −40 degrees centigrade both inclusive, current efficiency and life of blue were able to be improved.

While the present application has been described with reference to the embodiment and the examples, the present application is not limited to the foregoing embodiment and the foregoing examples, and various modifications may be made.

For example, the material, the thickness, the film-forming method, the film-forming conditions and the like of each layer are not limited to those described in the foregoing embodiment and the foregoing examples, but other material, other thickness, other film-forming method, and other film-forming conditions may be adopted.

TABLE 5

| Example | Light emitting color | Hole transport layer | Blue light emitting layer (common layer) | Blue hole transport layer: heating temperature | Blue hole transport layer: heating environmental dew point | Blue hole transport layer: heating environmental oxygen concentration | Drive voltage (V) | Current efficiency (Cd/A) | Chromatic coordinate (x, y) | Acceleration test T90 (h) |
|---|---|---|---|---|---|---|---|---|---|---|
| Example 15 | Blue | Compound 1(56) | 2(20)/103 | 100 deg C. | −60 deg C. | 1000 ppm | 7.9 | 5 | 0.15, 0.15 | 90 h |
| Example 16 | Blue | | | | | 100 pm | 6 | 6.9 | 0.15, 0.15 | 100 h |
| Example 1 | Blue | | | | | 10 ppm | 5.3 | 7.3 | 0.15, 0.15 | 240 h |
| Example 17 | Blue | | | | | 1 ppm | 5.2 | 7.3 | 0.15, 0.15 | 240 h |
| Example 18 | Blue | | | | | 0.1 ppm | 5.2 | 7.4 | 0.15, 0.15 | 245 h |

Further, in the foregoing embodiment and the foregoing examples, the description has been specifically given of the structures of the organic EL devices 10R, 10G, and 10B. However, it is not always necessary to provide all layers, and other layer may be further provided.

Further, in the foregoing embodiment, the description has been given of the active matrix display unit. However, the present application is able to be also applied to a passive matrix display unit. Furthermore, the structure of the pixel drive circuit for driving the active matrix is not limited to the structure described in the foregoing embodiment. If necessary, a capacity device or a transistor may be added. In this case, according to the change of the pixel drive circuit, a necessary drive circuit may be added in addition to the foregoing signal line drive circuit 120 and the foregoing scanning line drive circuit 130.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of manufacturing an organic EL display unit comprising:
    forming a lower electrode respectively for a red organic EL device, a green organic EL device, and a blue organic EL device on a substrate;
    forming a hole injection layer respectively for the red organic EL device, the green organic EL device, and the blue organic EL device on the lower electrode by coating method;
    forming a hole transport layer made of a polymer material respectively for the red organic EL device and the green organic EL device on the hole injection layer by coating method;
    forming a red light emitting layer made of a polymer material on the hole transport layer for the red organic EL device by coating method;
    forming a green light emitting layer made of a polymer material on the hole transport layer for the green organic EL device by coating method;
    forming a hole transport layer made of a low molecular material on the hole injection layer of the blue organic EL device by coating method;
    forming a blue light emitting layer made of a low molecular material on the whole area of the red light emitting layer, the green light emitting layer, and the hole transport layer for the blue organic EL device by evaporation method; and
    sequentially forming an electron transport layer, an electron injection layer, and an upper electrode on the whole area of the blue light emitting layer; and
    wherein the hole transport layer of the blue organic EL device is made of an organic material expressed by General formula 1 shown in Chemical formula 1:

Chemical formula 1

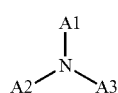

General formula 1 where A1 to A3 in the General formula 1 respectively and independently represent a substituted or unsubstituted aryl group or a substituted or unsubstituted heterocyclic group.

2. The method of manufacturing an organic EL display unit according to claim 1, wherein ink jet method or nozzle coating method is used as the coating method.

3. A method of manufacturing an organic EL display unit comprising:
    forming a lower electrode respectively for a red organic EL device, a green organic EL device, and a blue organic EL device on a substrate;
    forming a hole injection layer respectively for the red organic EL device, the green organic EL device, and the blue organic EL device on the lower electrode by coating method;
    forming a hole transport layer made of a polymer material respectively for the red organic EL device and the green organic EL device on the hole injection layer by coating method;
    forming a red light emitting layer made of a polymer material on the hole transport layer for the red organic EL device by coating method;
    forming a green light emitting layer made of a polymer material on the hole transport layer for the green organic EL device by coating method;
    forming a hole transport layer made of a low molecular material on the hole injection layer of the blue organic EL device by coating method;
    forming a blue light emitting layer made of a low molecular material on the whole area of the red light emitting layer, the green light emitting layer, and the hole transport layer for the blue organic EL device by evaporation method; and
    sequentially forming an electron transport layer, an electron injection layer, and an upper electrode on the whole area of the blue light emitting layer;
    wherein the blue light emitting layer is made of a compound expressed by General formula 2 shown in Chemical formula 2:

Chemical formula 2

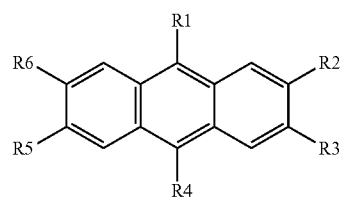

General formula 2 where R1 to R6 in General formula 2 respectively and independently represent hydrogen, halogen, a hydroxyl group, a substituted or unsubstituted carbonyl group having 20 or less carbon atoms, a substituted or unsubstituted carbonylester group having 20 or less carbon atoms, a substituted or unsubstituted alkyl group having 20 or less carbon atoms, a substituted or unsubstituted alkenyl group having 20 or less carbon atoms, a substituted or unsubstituted alkoxyl group having 20 or less carbon atoms, a cyano group, a nitro group, a substituted or unsubstituted silyl group having 30 or less carbon atoms, a substituted or unsubstituted aryl group having 30 or less carbon atoms, a substituted or unsubstituted heterocyclic group having 30 or less carbon atoms, or a substituted or unsubstituted amino group having 30 or less carbon atoms.

4. The method of manufacturing an organic EL display unit according to claim 3, wherein the hole injection layer is made of at least one of a polyaniline and oligoaniline material.

5. The method of manufacturing an organic EL display unit according to claim 4, wherein the step of forming the hole transport layer of the red organic EL device and the green organic EL device, the step of forming the red light emitting layer, the step of forming the green light emitting layer, and the step of forming the hole transport layer of the blue organic EL device are performed in atmosphere in which a main component is nitrogen, an oxygen content ratio is from 0.1 ppm to 100 ppm both inclusive, and a dew point is from −80 degrees centigrade to −40 degrees centigrade both inclusive.

6. The method of manufacturing an organic EL display unit according to claim 5, wherein the step of forming the hole transport layer of the red organic EL device and the green organic EL device, the step of forming the red light emitting layer, the step of forming the green light emitting layer, and the step of forming the hole transport layer of the blue organic EL device include
- a step of coating with a solution containing an organic material and a solvent or a dispersion liquid containing a dispersion medium that composes the hole transport layer, the red light emitting layer, or the green light emitting layer,
- a step of forming the hole transport layer, the red light emitting layer, or the green light emitting layer by removing the solvent or the dispersion medium by drying, and
- a step of heating the hole transport layer, the red light emitting layer, or the green light emitting layer at temperature from 50 degrees centigrade to 150 degrees centigrade both inclusive.

* * * * *